(12) United States Patent
Kataishi et al.

(10) Patent No.: US 9,112,086 B2
(45) Date of Patent: Aug. 18, 2015

(54) PHOTOELECTRIC CONVERSION DEVICE

(71) Applicant: SEMICONDUCTOR ENERGY LABORATORY CO., LTD., Atsugi-shi, Kanagawa-ken (JP)

(72) Inventors: Riho Kataishi, Kanagawa (JP); Yoshinobu Asami, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 137 days.

(21) Appl. No.: 13/657,015

(22) Filed: Oct. 22, 2012

(65) Prior Publication Data
US 2013/0119374 A1    May 16, 2013

(30) Foreign Application Priority Data

Nov. 10, 2011 (JP) .................. 2011-246341
Nov. 10, 2011 (JP) .................. 2011-246346

(51) Int. Cl.
*H01L 29/10* (2006.01)
*H01L 31/0232* (2014.01)
*H01L 31/074* (2012.01)
*H01L 31/0747* (2012.01)

(52) U.S. Cl.
CPC .......... *H01L 31/074* (2013.01); *H01L 31/0747* (2013.01); *Y02E 10/50* (2013.01)

(58) Field of Classification Search
CPC .... H01L 31/074; H01L 31/0747; Y02E 10/50
USPC ............ 257/43, 428, 429, 436, 437, E31.004, 257/E31.043, E31.124, E31.127
See application file for complete search history.

(56) References Cited

U.S. PATENT DOCUMENTS 6,534,704 B2   3/2003   Hashimoto et al.
7,674,647 B2   3/2010   Arai
(Continued)

FOREIGN PATENT DOCUMENTS

JP   04-1330671   5/1992
JP   07-130661    5/1995
(Continued)

OTHER PUBLICATIONS

Osterwald.C et al., "Molybdenum trioxide (MoO3)/silicon photodiodes,", Appl. Phys. Lett. (Applied Physics Letters), Nov. 15, 1979, vol. 35, No. 10, pp. 775-776.
(Continued)

*Primary Examiner* — Hung Vu
(74) *Attorney, Agent, or Firm* — Nixon Peabody LLC; Jeffrey L. Costellia

(57) ABSTRACT

To provide a photoelectric conversion device which has little light loss caused by light absorption in a window layer and has favorable electric characteristics. The photoelectric conversion device includes, between a pair of electrodes, a light-transmitting semiconductor layer which has one conductivity type and serves as a window layer, and a silicon semiconductor substrate having a conductivity type for forming a p-n junction or a silicon semiconductor layer having a conductivity type for forming a p-i-n junction. The light-transmitting semiconductor layer can be formed using an inorganic compound containing, as its main component, an oxide of a metal belonging to any of Groups 4 to 8 of the periodic table. The band gap of the metal oxide is greater than or equal to 2 eV.

19 Claims, 24 Drawing Sheets

(56) References Cited

U.S. PATENT DOCUMENTS

| | | |
|---|---|---|
| 7,871,849 B2 | 1/2011 | Arai |
| 7,875,945 B2 * | 1/2011 | Krasnov et al. ............... 257/436 |
| 8,691,613 B2 * | 4/2014 | Yoshimi et al. ................. 438/56 |
| 2005/0284518 A1 | 12/2005 | Yamada et al. |
| 2007/0277874 A1 | 12/2007 | Dawson-Elli et al. |
| 2007/0277875 A1 | 12/2007 | Gadkaree et al. |
| 2009/0139558 A1 | 6/2009 | Yamazaki et al. |
| 2011/0308582 A1 | 12/2011 | Kataishi et al. |
| 2011/0308589 A1 | 12/2011 | Kataishi et al. |
| 2012/0234392 A1 | 9/2012 | Asami et al. |
| 2013/0056715 A1 | 3/2013 | Asami et al. |

FOREIGN PATENT DOCUMENTS

| | | |
|---|---|---|
| JP | 10-135497 | 5/1998 |
| JP | 2004-214300 | 7/2004 |
| JP | 2004-342678 | 12/2004 |
| JP | 2005-109360 | 4/2005 |

OTHER PUBLICATIONS

Park.S et al., "Towards a high efficiency amorphous silicon solar cell using molybdenum oxide as a window layer instead of conventional p-type amorphous silicon carbide,", Appl. Phys. Lett. (Applied Physics Letters), Aug. 8, 2011, vol. 99, No. 6, pp. 063504-01-063504-3.

\* cited by examiner

PHOTOELECTRIC CONVERSION DEVICE

BACKGROUND OF THE INVENTION

1. Field of the Invention

The present invention relates to a photoelectric conversion device including a window layer formed using an inorganic compound.

2. Description of the Related Art

In recent years, photoelectric conversion devices that do not produce carbon dioxide during power generation have attracted attention as a measure against global warming. As typical examples thereof, bulk-type solar cells which use crystalline silicon substrates such as single crystalline and polycrystalline silicon substrates and thin-film type solar cells which use a thin film such as an amorphous silicon film or a microcrystalline silicon film have been known.

In solar cells using a silicon substrate, a structure having a so-called homo junction is widely used. In such a structure, a layer having a conductivity type opposite to that of the silicon substrate is formed on one surface side of the silicon substrate by diffusion of impurities. Alternatively, a structure with a heterojunction is known in which amorphous silicon having different optical band gap and conductivity type from those of a silicon substrate is formed on one surface side of the silicon substrate (see Patent Documents 1 and 2).

A thin-film type solar cell includes a thin film which is formed using a required amount of silicon by a plasma CVD method or the like; thus, resource saving can be achieved as compared to the case of a bulk type solar cell. Further, by using a laser processing method, a screen printing method, or the like, the thin-film solar type cells can be easily formed in an integral manner and a large area of solar cells can be easily obtained; thus, manufacturing cost thereof can be reduced. However, the thin-film type solar cells have a disadvantage in lower conversion efficiency than the bulk-type solar cells.

In order to improve the conversion efficiency of the thin-film type solar cell, a method in which silicon oxide is used instead of silicon for a p-type semiconductor layer serving as a window layer has been disclosed (for example, see Patent Document 3). A non-single-crystal silicon based p-type semiconductor layer formed as a thin film is doped with an impurity and thus has a higher light absorption property than an i-type semiconductor layer which is a light absorption layer, which causes light loss caused by light absorption. An object of a technique disclosed in Patent Document 1 is to suppress light loss caused by light absorption in a window layer by using silicon oxide having a larger optical band gap than silicon for a p-type semiconductor layer.

REFERENCE

Patent Document

[Patent Document 1] Japanese Published Patent Application No. H04-130671
[Patent Document 2] Japanese Published Patent Application No. H10-135497
[Patent Document 3] Japanese Published Patent Application No. H07-130661

SUMMARY OF THE INVENTION

In the above solar cell using a silicon substrate, since crystalline silicon or amorphous silicon is used for a window layer, the light loss due to light absorption in the window layer is caused.

Although photo-carriers are generated also in the window layer, minority carriers are likely to be recombined in the window layer; thus, photo-carriers taken out as current are almost generated on a back electrode side in the silicon substrate, which is the opposite side of the p-n junction. That is, light absorbed in the window layer is not substantially utilized, and accordingly, the window layer is preferably formed using a material having a light-transmitting property with respect to light in a wavelength range where silicon has optical sensitivity.

In a thin-film type solar cell in which silicon oxide is used for a p-type semiconductor layer serving as a window layer, the light loss due to light absorption in the window layer is reduced, leading to an increase in rate of light which reaches a light absorption layer. However, in silicon oxide having a larger band gap than silicon, resistance is not sufficiently reduced; thus, the loss of current due to resistance is a problem to be solved for further improvement in the characteristics.

Thus, an object of one embodiment of the present invention is to provide a photoelectric conversion device which has little light loss caused by light absorption in a window layer and has favorable electric characteristics.

One embodiment of the present invention disclosed in this specification is a p-n junction or p-i-n junction photoelectric conversion device which includes a light-transmitting semiconductor layer formed using an inorganic compound containing an oxide of a metal belonging to any of Groups 4 to 8 of the periodic table as its main component.

Another embodiment of the present invention disclosed in this specification is a photoelectric conversion device including, between a pair of electrodes, a silicon substrate having one conductivity type; a light-transmitting semiconductor layer which is formed over one surface of the silicon substrate and has a conductivity type opposite to that of the silicon substrate; and a light-transmitting conductive film formed over the light-transmitting semiconductor layer. The light-transmitting semiconductor layer is formed using an inorganic compound containing an oxide of a metal belonging to any of Groups 4 to 8 of the periodic table as its main component.

Another embodiment of the present invention disclosed in this specification is a photoelectric conversion device including, between a pair of electrodes, a silicon substrate having one conductivity type; a first silicon semiconductor layer which is formed over one surface of the silicon substrate and has i-type conductivity or a conductivity type opposite to that of the silicon substrate; a light-transmitting semiconductor layer which is formed over the first silicon semiconductor layer and has a conductivity type opposite to that of the silicon substrate; a light-transmitting conductive film formed over the light-transmitting semiconductor layer; a second silicon semiconductor layer which is formed over the other surface of the silicon substrate and has i-type conductivity or the same conductivity type as the silicon substrate; and a third silicon semiconductor layer which is formed over the second silicon semiconductor layer and has the same conductivity type as the silicon substrate. Further, the light-transmitting semiconductor layer is formed using an inorganic compound containing an oxide of a metal belonging to any of Groups 4 to 8 of the periodic table as its main component.

It is to be noted that the ordinal numbers such as "first" and "second" in this specification, etc. are assigned in order to avoid confusion among components, but not intended to limit the number or order of the components.

The second silicon semiconductor layer preferably has a lower carrier concentration than the silicon substrate, and the third silicon semiconductor layer preferably has a higher carrier concentration than the silicon substrate.

Further, the light-transmitting semiconductor layer preferably has a higher carrier concentration than the first silicon semiconductor layer.

Another embodiment of the present invention disclosed in this specification is a photoelectric conversion device including, between a pair of electrodes, a silicon substrate having one conductivity type; a light-transmitting semiconductor layer which is formed over one surface of the silicon substrate and has a conductivity type opposite to that of the silicon substrate; a light-transmitting conductive film formed over the light-transmitting semiconductor layer; a first silicon semiconductor layer which is formed over the other surface of the silicon substrate and has i-type conductivity or the same conductivity type as the silicon substrate; and a second silicon semiconductor layer which is formed over the first silicon semiconductor layer and has the same conductivity type as the silicon substrate. Further, the light-transmitting semiconductor layer is formed using an inorganic compound containing an oxide of a metal belonging to any of Groups 4 to 8 of the periodic table as its main component.

The first silicon semiconductor layer preferably has a lower carrier concentration than the silicon substrate, and the second silicon semiconductor layer preferably has a higher carrier concentration than the silicon substrate.

Another embodiment of the present invention disclosed in this specification is a photoelectric conversion device including, between a pair of electrodes, a light-transmitting semiconductor layer, a first silicon semiconductor layer, and a second silicon semiconductor layer, which are stacked in this order to be in contact with each other. Further, the light-transmitting semiconductor layer has one conductivity type, the first silicon semiconductor layer has i-type conductivity, and the second silicon semiconductor layer has a conductivity type opposite to that of the light-transmitting semiconductor layer. Furthermore, the light-transmitting semiconductor layer is formed using an inorganic compound containing an oxide of a metal belonging to any of Groups 4 to 8 of the periodic table as its main component.

The first silicon semiconductor layer is preferably non-single-crystal, amorphous, microcrystalline, or polycrystalline.

Another embodiment of the present invention disclosed in this specification is a photoelectric conversion device including, between a pair of electrodes, a first light-transmitting semiconductor layer, a first silicon semiconductor layer, a second silicon semiconductor layer, a second light-transmitting semiconductor layer, a third silicon semiconductor layer, and a fourth silicon semiconductor layer, which are stacked in this order to be in contact with each other. The first light-transmitting semiconductor layer and the second light-transmitting semiconductor layer have one conductivity type. The first silicon semiconductor layer and the third silicon semiconductor layer have i-type conductivity. The second silicon semiconductor layer and the fourth silicon semiconductor layer have a conductivity type opposite to those of the first light-transmitting semiconductor layer and the second light-transmitting semiconductor layer. The first light-transmitting semiconductor layer and the second light-transmitting semiconductor layer are formed using an inorganic compound containing an oxide of a metal belonging to any of Groups 4 to 8 of the periodic table as its main component.

The first silicon semiconductor layer is preferably amorphous, and the third silicon semiconductor layer is preferably microcrystalline or polycrystalline.

In one embodiment of the present invention described above, the band gap of an oxide of a metal contained in each of the light-transmitting semiconductor layer, the first light-transmitting semiconductor layer, and the second light-transmitting semiconductor layer is preferably greater than or equal to 2 eV.

Further, in one embodiment of the present invention described above, as an oxide of a metal contained in each of the light-transmitting semiconductor layer, the first light-transmitting semiconductor layer, and the second light-transmitting semiconductor layer, vanadium oxide, niobium oxide, tantalum oxide, chromium oxide, molybdenum oxide, tungsten oxide, manganese oxide, or rhenium oxide can be used.

With use of one embodiment of the present invention, a photoelectric conversion device which has little light loss caused by light absorption in a window layer and has favorable electric characteristics can be provided.

DETAILED DESCRIPTION OF THE INVENTION

Figure 1:
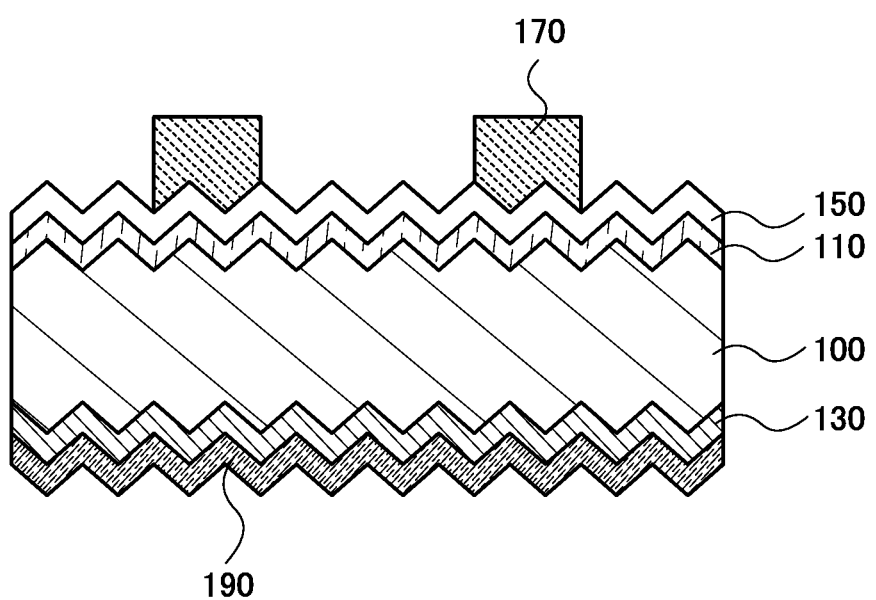
FIG. 1 is a cross-sectional view illustrating a photoelectric conversion device of one embodiment of the present invention.

Hereinafter, embodiments and an example of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments and the example. In the drawings for explaining the embodiments, the same portions or portions having similar functions are denoted by the same reference numerals, and description of such portions is not repeated in some cases.

(Embodiment 1)

In this embodiment, a photoelectric conversion device using a silicon substrate which is one embodiment of the present invention, and a method for manufacturing the photoelectric conversion device will be described.

FIG. 1 is a cross-sectional view of a photoelectric conversion device of one embodiment of the present invention. The photoelectric conversion device includes a silicon substrate 100; a light-transmitting semiconductor layer 110 formed over one surface of the silicon substrate; an impurity region 130 formed over the other surface of the silicon substrate; a light-transmitting conductive film 150 formed over the light-transmitting semiconductor layer 110; a first electrode 170 in contact with the light-transmitting conductive film; and a second electrode 190 in contact with the impurity region 130. Note that the first electrode 170 is a grid electrode, and a surface on the first electrode 170 side serves as a light-receiving surface.

Further, FIG. 1 illustrates an example in which a front surface and a back surface of the silicon substrate 100 are processed to have unevenness. On the surface processed to have unevenness, incident light is reflected in a multiple manner, and the light obliquely propagates into a photoelectric conversion region; thus, the optical path length is increased. In addition, a so-called light trapping effect in which reflected light by the back surface is totally reflected at the front surface can occur.

Figure 2:
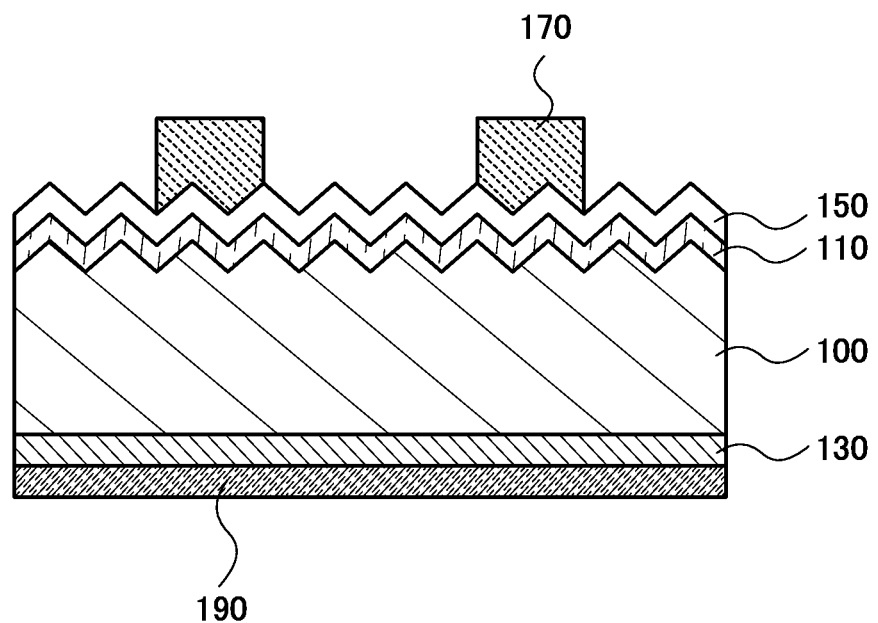
FIG. 2 is a cross-sectional view illustrating a photoelectric conversion device of one embodiment of the present invention.

Note that as illustrated in FIG. 2, a structure in which only one of surfaces (the front surface and the back surface) of the silicon substrate 100 is processed to have unevenness may be employed. The surface area of the silicon substrate is increased by the unevenness; thus, while the optical effect described above can be obtained, the absolute amount of surface defects is increased. Therefore, in consideration of the balance between the optical effect and the amount of the surface defects, a practitioner may determine the structure so that more favorable electric characteristics can be obtained.

The silicon substrate 100 has one conductivity type, and the light-transmitting semiconductor layer 110 is a semiconductor layer having a conductivity type opposite to that of the silicon substrate 100. Accordingly, a p-n junction is formed between the silicon substrate 100 and the light-transmitting semiconductor layer 110.

In the case where the light-transmitting semiconductor layer 110 is formed using a material having p-type conductivity, a silicon substrate having n-type conductivity is used as the silicon substrate 100. Further, in the case where the light-transmitting semiconductor layer 110 is formed using a material having n-type conductivity, a silicon substrate having p-type conductivity may be used as the silicon substrate 100.

Figure 3:
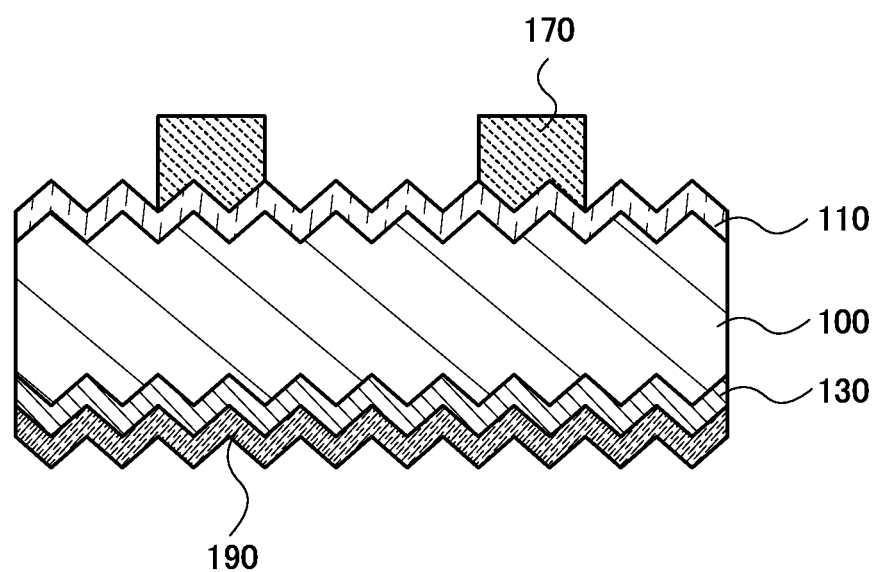
FIG. 3 is a cross-sectional view illustrating a photoelectric conversion device of one embodiment of the present invention.

The light-transmitting conductive film 150 is preferably formed over the light-transmitting semiconductor layer 110. Providing the light-transmitting conductive film 150 enables the loss of current due to resistance in the light-transmitting semiconductor layer 110 to be reduced. However, in the case where the resistance of the light-transmitting semiconductor layer 110 is sufficiently low or in the case where the manufactured photoelectric conversion device is used for low-current applications which are not affected by the loss of current due to its resistance, as illustrated in FIG. 3, a structure in which the light-transmitting conductive film 150 is not provided may be employed.

Further, an oxide layer may be provided between the silicon substrate 100 and the light-transmitting semiconductor layer 110. For the oxide layer, silicon oxide ($SiO_x$ (x>0)), silicon dioxide ($SiO_2$), silicon monoxide (SiO), silicon oxide ($SiO_x$ (x>0)) in which silicon dioxide and silicon are mixed, and a compound of silicon, oxygen, and a metal contained in the light-transmitting semiconductor layer can be used. The oxide layer can be obtained by oxidation or deposition using an electric furnace, a plasma CVD apparatus, a plasma treatment apparatus, or the like. Alternatively, the oxide layer may be formed in such a manner that the silicon substrate 100 and the light-transmitting semiconductor layer 110 are reacted with each other using heat, infrared rays, or the like.

The thickness of the oxide layer can be 0.5 nm to 10 nm, preferably 0.5 nm to 5 nm. Since the oxide layer is interposed between the silicon substrate 100 and the light-transmitting semiconductor layer 110, the oxide layer is preferably an extremely thin film through which tunnel current flows. The oxide layer is interposed between the silicon substrate 100 and the light-transmitting semiconductor layer 110, whereby the silicon substrate 100 and the light-transmitting semiconductor layer 110 can be favorably bonded to each other even when there is a lattice mismatch or the like.

The impurity region 130 is a back surface field (BSF) layer, which has the same conductivity type as the silicon substrate 100 and has higher carrier concentration than the silicon substrate 100. When the BSF layer is formed, an $n$-$n^+$ junction or a $p$-$p^+$ junction is formed, and minority carriers are repelled by the electric field of the $n$-$n^+$ junction or the $p$-$p^+$ junction and attracted to the p-n junction side, whereby recombination of carriers in the vicinity of the second electrode 190 can be prevented.

Note that in this specification, in the case where materials which have the same conductivity type and have different carrier concentrations needs to be distinguished, the conductivity type of a material having a relatively higher carrier concentration than an n-type or p-type silicon substrate is referred to as $n^+$-type or $p^+$-type, whereas the conductivity type of a material having a relatively lower carrier concentration than an n-type or p-type silicon substrate is referred to as $n^-$-type or $p^-$-type.

Figure 4:
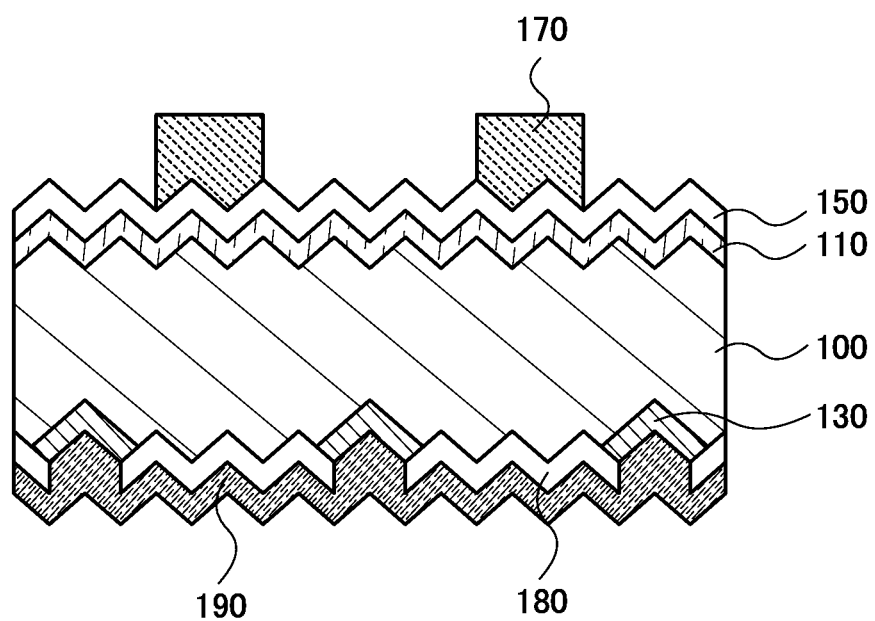
FIG. 4 is a cross-sectional view illustrating a photoelectric conversion device of one embodiment of the present invention.

Further, as illustrated in FIG. 4, a structure in which a passivation layer 180 is provided on the back surface of the silicon substrate 100 and the impurity region 130 is provided so as to overlap with an opening of the passivation layer may be employed. As the passivation layer 180, in addition to a silicon oxide film or a silicon nitride film, a light-transmitting semiconductor layer having a conductivity type opposite to that of the light-transmitting semiconductor layer 110 can be used. Providing the passivation layer 180 enables defects on the back surface of the silicon substrate 100 to be reduced, so that electric characteristics of the photoelectric conversion device can be improved.

Note that the photoelectric conversion device may have a structure in which structures of FIG. 1, FIG. 2, FIG. 3, and FIG. 4 are combined as appropriate.

For the light-transmitting semiconductor layer 110 of one embodiment of the present invention, it is possible to use an inorganic compound containing, as its main component, a transition metal oxide having a band gap greater than or equal to 2 eV, preferably greater than or equal to 2.5 eV. It is particularly preferable that an inorganic compound containing, as its main component, an oxide of a metal belonging to any of Groups 4 to 8 in the periodic table be used. The oxide of the metal has high light-transmitting property with respect to light in a wavelength range which is absorbed by silicon.

Specifically, as the metal oxide, vanadium oxide, niobium oxide, tantalum oxide, chromium oxide, molybdenum oxide, tungsten oxide, manganese oxide, rhenium oxide, or the like can be used. Among these, molybdenum oxide is especially preferable since it is stable in the air, has a low hygroscopic property, and is easily handled.

Further, an impurity is added to the metal oxide, whereby the conductivity type can be changed. Furthermore, in the case where an impurity is not intentionally added to the metal oxide, a defect in the metal oxide, an oxygen defect in the metal oxide, and a slight amount of an impurity in the metal oxide, which is contained during film formation, form a donor level or an acceptor level, and thus, the metal oxide exhibits n-type or p-type conductivity in some cases.

Figure 13A:
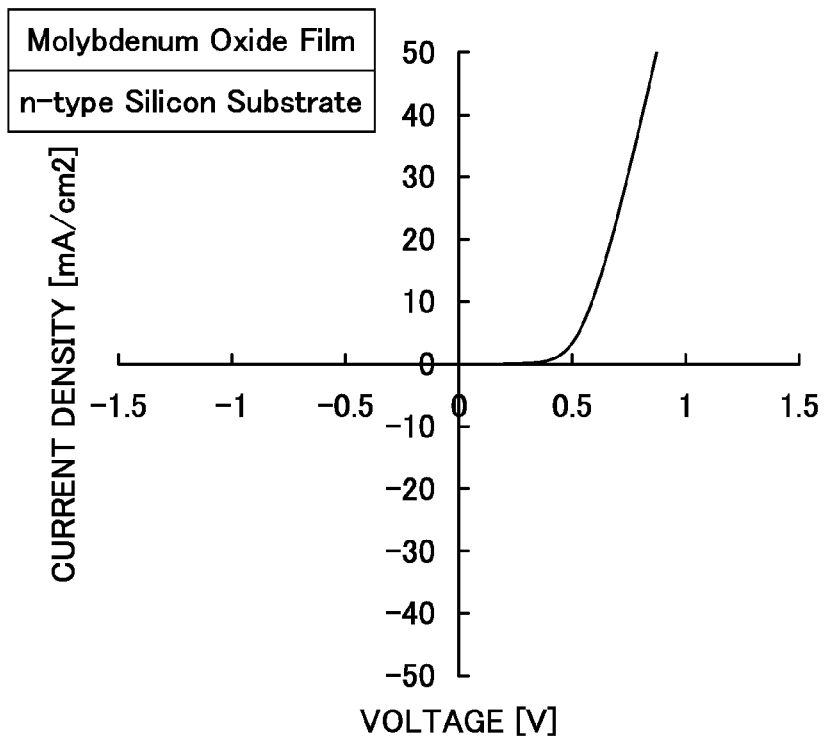
FIGS. 13A and 13B each show I-V characteristics of an element in which a molybdenum oxide film is formed over a silicon substrate.
Figure 13B:
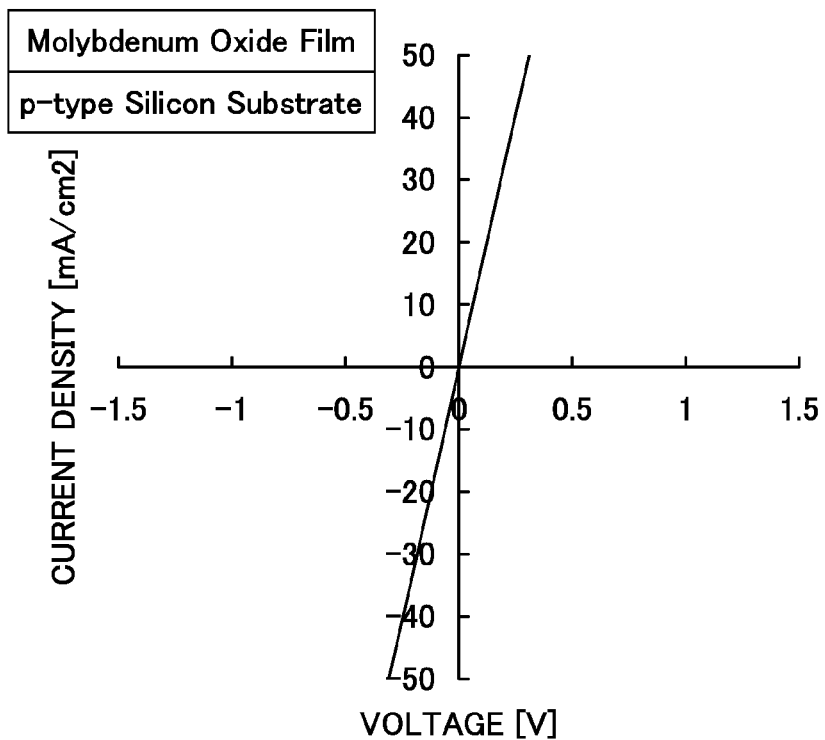

For example, when molybdenum trioxide powder (4N MOO03PB) manufactured by Kojundo Chemical Laboratory Co., Ltd. is put in a tungsten boat (BB-3) manufactured by Furuuchi Chemical Corporation, and resistance-heating evaporation is performed on silicon substrates at a deposition rate of 0.2 nm/sec in vacuum of less than or equal to $1 \times 10^{-4}$ Pa, elements having different I-V characteristics because of difference in the conductivity type between the silicon substrates are formed. FIG. 13A shows I-V characteristics of an element in which a molybdenum oxide film is formed over an n-type silicon substrate by the above method, and FIG. 13B shows I-V characteristics of an element in which a molybdenum oxide film is formed over a p-type silicon substrate by the above method. FIG. 13A shows a rectifying property, and FIG. 13B shows an ohmic property. Accordingly, it can be said that a p-n junction is formed in the element exhibiting the property in FIG. 13A. Thus, the molybdenum oxide films formed by the above method exhibit a rectifying property only in a heterojunction using the n-type silicon substrate, and thus it is found that the molybdenum oxide films have p-type conductivity with a high carrier concentration.

Note that the electric conductivity, the refractive index, the extinction coefficient, and the optical band gap obtained from a Tauc plot of each of the molybdenum oxide films formed by the above evaporation are $1 \times 10^{-6}$ S/cm to $3.8 \times 10^{-3}$ S/cm (dark conductivity), 1.6 to 2.2 (a wavelength: 550 nm), $6 \times 10^{-4}$ to $3 \times 10^{-3}$ (a wavelength of 550 nm), and 2.8 eV to 3 eV, respectively.

Further, the metal oxide has a high passivation effect and can reduce defects on a surface of silicon, which can improve the lifetime of carriers.

For example, molybdenum oxide films are formed over both surfaces of an n-type single crystal silicon substrate having a resistivity of approximately 9 Ω·cm and serve as passivation films. According to the measurement by a microwave photoconductivity decay (μ-PCD) method, the effective lifetime at this time is about 400 μsec. Further, the lifetime of the n-type single crystal silicon substrate, on which chemical passivation using an alcoholic iodine solution has been performed, which is the bulk lifetime of the single crystal silicon substrate, is also about 400 μsec. Note that the effective lifetime of the n-type single crystal silicon substrate where a passivation film is not formed is about 40 μsec.

Figure 14:
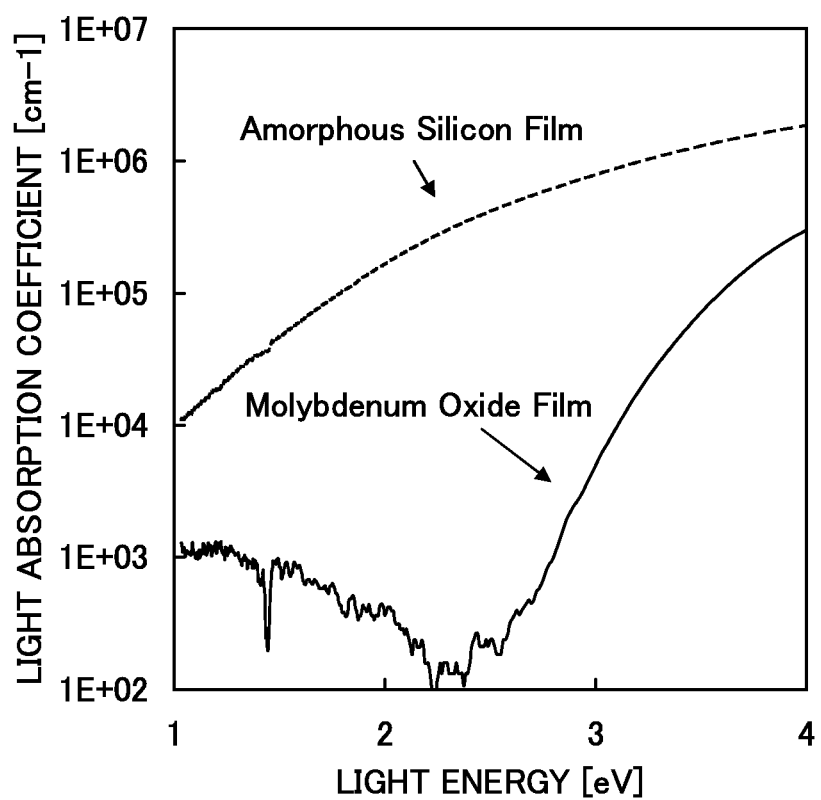
FIG. 14 shows comparison of the light absorption coefficient between a molybdenum oxide film and an amorphous silicon film.

In FIG. 14, the light absorption coefficient of a molybdenum oxide film formed over a glass substrate by the above evaporation is compared with that of an amorphous silicon film formed by a plasma CVD method, which is a comparative example. The light absorption coefficient of the molybdenum oxide film is small in a wide wavelength range, and thus it is found that the molybdenum oxide film has a high light-transmitting property.

In conventional photoelectric conversion devices, a window layer is formed using a silicon material; therefore, the light absorption in the window layer is a heavy loss in the conventional photoelectric conversion devices. In one embodiment of the present invention, the light-transmitting metal oxide is used for a window layer of a photoelectric conversion device, whereby the light loss caused by light absorption in the window layer is reduced, and photoelectric conversion can be efficiently performed in a light absorption region. Further, as described above, the metal oxide has extremely a high passivation effect on the silicon surface. Accordingly, the electric characteristics of the photoelectric conversion device can be improved.

Next, a method for manufacturing the photoelectric conversion device illustrated in FIG. 1 will be described with reference to FIGS. 5A to 5C and FIGS. 6A to 6C.

A single crystal silicon substrate or a polycrystalline silicon substrate can be used for the silicon substrate 100 that can be used in one embodiment of the present invention. The manufacturing method and the conductivity type of the silicon substrate are not specifically limited. In this embodiment, described is an example in which an n-type single crystal silicon substrate whose surface corresponds to the (100) plane and which is manufactured by a Magnetic Czochralski (MCZ) method is used.

Figure 5A:
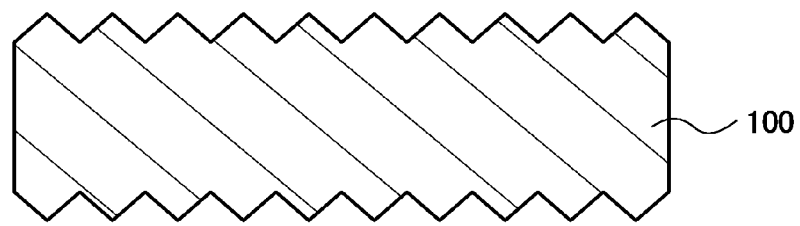
FIGS. 5A to 5C are cross-sectional views illustrating a process of a method for manufacturing a photoelectric conversion device of one embodiment of the present invention.

Next, the front surface and the back surface of the silicon substrate 100 are processed to have unevenness (see FIG. 5A). Note that here, an example in which the above-described single crystal silicon substrate having a (100) plane as a surface is used is employed to describe a method for processing the silicon substrate 100 to have unevenness. In the case where a polycrystalline silicon substrate is used as the silicon substrate 100, unevenness may be formed by a dry etching method, a wet etching using a metal catalyst such as silver, or the like.

In the case where the initial single crystal silicon substrate is a substrate which is subjected to only a slicing process, a damage layer with a thickness of 10 µm to 20 µm, remaining on the surface of the single crystal silicon substrate, is removed by a wet etching process. For an etchant, an alkaline solution with a relatively high concentration, for example, 10% to 50% sodium hydroxide solution, or 10% to 50% potassium hydroxide solution can be used. Alternatively, a mixed acid in which hydrofluoric acid and nitric acid are mixed, or the mixed acid to which acetic acid is further added may be used.

Next, impurities adhering to the surface of the single crystal silicon substrate from which the damage layer has been removed are removed by acid cleaning. As an acid, for example, a mixture (FPM) of 0.5% hydrofluoric acid and 1% hydrogen peroxide, or the like can be used. Alternatively, RCA cleaning or the like may be performed. Note that this acid cleaning may be omitted.

The unevenness is formed utilizing a difference in etching rates among plane orientations in etching of the crystalline silicon using the alkaline solution. For an etchant, an alkaline solution with a relatively low concentration, for example, 1% to 5% sodium hydroxide solution, or 1% to 5% potassium hydroxide solution can be used, preferably several percent isopropyl alcohol is added thereto. The temperature of the etchant is 70° C. to 90° C., and the single crystal silicon substrate is soaked in the etchant for 30 to 60 minutes. By this treatment, unevenness including a plurality of minute projections each having a substantially square pyramidal shape and recessions formed between adjacent projections can be formed on the surfaces of the single crystal silicon substrate.

Next, oxide layers which are non-uniformly formed on the silicon surface in the etching step for forming the unevenness are removed. Another purpose of removing the oxide layers is to remove a component of the alkaline solution, which is likely to remain in the oxide layers. When an alkali metal ion, e.g., a Na ion or a K ion enters silicon, the lifetime is decreased, and the electric characteristics of the photoelectric conversion device are drastically lowered as a result. Note that in order to remove the oxide layer, 1 to 5 percent diluted hydrofluoric acid may be used.

Next, the surfaces of the single crystal silicon substrate are preferably etched with a mixed acid in which hydrofluoric acid and nitric acid are mixed, or the mixed acid to which acetic acid is further added so that impurities such as a metal component are removed from the surfaces. By adding the acetic acid, oxidizing ability of nitric acid can be kept so as to stably perform the etching, and the etching rate can be adjusted. For example, a volume ratio of hydrofluoric acid (approximately 50%), nitride acid (60% or more) and acetic acid (90% or more) can be 1:1.5 to 3:2 to 4. Note that in this specification, the mixed acid solution containing hydrofluoric acid, nitric acid, and acetic acid is referred to as HF-nitric-acetic acid. Further, in the etching with the HF-nitric-acetic acid, angles in cross sections of vertexes of the projections are made larger, so that a surface area can be reduced, and the absolute amount of surface defects can be reduced. Note that in the case where the etching with the HF-nitric-acetic acid is performed, the above step of removing the oxide layers with diluted hydrofluoric acid can be omitted. Through the steps up to here, the surfaces of the single crystal silicon substrate that is the silicon substrate 100 can have unevenness.

Figure 5B:
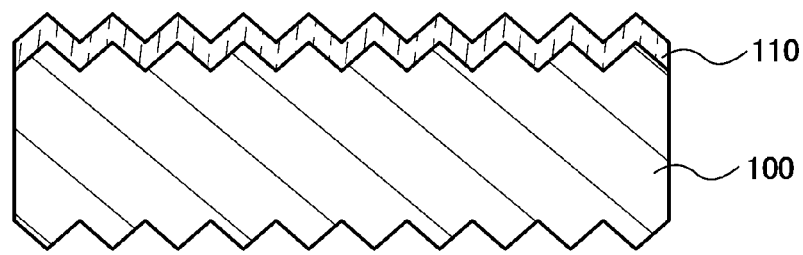

Next, after appropriate cleaning, the light-transmitting semiconductor layer 110 having p-type conductivity is formed over the front surface of the silicon substrate 100, which serves as a light-receiving surface (see FIG. 5B). For the light-transmitting semiconductor layer, the above-described metal oxide can be used. Here, an example in which a p-type molybdenum oxide film is formed will be described.

The p-type molybdenum oxide film can be formed by a vapor phase method such as an evaporation method, a sputtering method, or an ion plating method. As an evaporation method, a method in which a material of molybdenum oxide alone is evaporated, or a method in which a material of molybdenum oxide and an impurity imparting p-type conductivity are co-evaporated may be used. Note that the co-evaporation refers to an evaporation method in which evaporation is carried out from a plurality of evaporation sources at the same time in one treatment chamber. As a sputtering method, a method in which molybdenum oxide, molybdenum trioxide, molybdenum dioxide, molybdenum, or any of the above materials which contains an impurity imparting p-type conductivity is used as a target, and oxygen or a mixed gas of oxygen and a rare gas such as argon is used as a sputtering gas may be used. As an ion plating method, a method in which a film is formed in plasma containing oxygen using a material similar to the material used in the sputtering method described above may be used.

In this embodiment, a method in which a material of molybdenum oxide alone is evaporated is used. As an evaporation source, powder of molybdenum oxide can be used. The purity of the powder of molybdenum oxide is preferably 99.99% (4N) to 99.9999% (6N). The evaporation is preferably performed in a high vacuum of $5 \times 10^{-3}$ Pa or less, preferably $1 \times 10^{-4}$ Pa or less.

Figure 5C:
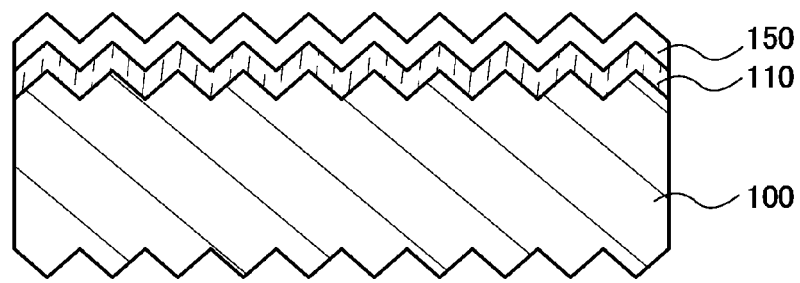

Next, the light-transmitting conductive film 150 is formed over the light-transmitting semiconductor layer 110 (see FIG. 5C). For the light-transmitting conductive film, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene, or the like. The light-transmitting conductive film is not limited to a single layer, and may be a stacked layer of different films. For example, a stacked layer of indium tin oxide and zinc oxide containing aluminum, a stacked layer of indium tin oxide and tin oxide containing fluorine, or the like can be used. The light-transmitting conductive film can be formed by a sputtering method or the like. The total thickness is preferably greater than or equal to 10 nm and less than or equal to 1000 nm. For example, the light-transmitting conductive film 150 is formed using indium tin oxide to a thickness of 70 nm.

Figure 6A:
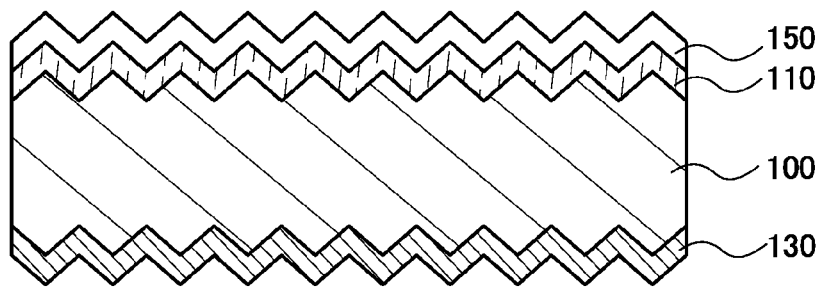
FIGS. 6A to 6C are cross-sectional views illustrating a process of a method for manufacturing the photoelectric conversion device of one embodiment of the present invention.

Next, impurities imparting n-type conductivity are diffused into a surface layer on the back surface of the silicon substrate 100 which is on the side opposite to the light-receiving surface, whereby the impurity region 130 is formed (see FIG. 6A). As an impurity imparting n-type conductivity, phosphorus, arsenic, antimony, or the like can be given. For example, the silicon substrate 100 is subjected to heat treatment at a temperature higher than or equal to 800° C. and lower than or equal to 900° C. in an atmosphere of phosphorus oxychloride, whereby phosphorus can be diffused at a depth of approximately 0.5 µm from the surface of the silicon substrate 100.

Note that the impurity region 130 may be formed after the unevenness is formed (after the structure illustrated in FIG. 5A is formed). In this case, the following process may be performed: the light-receiving surface is covered with a mask formed using a heat resistant material such as an inorganic insulating film by a known method so that the impurities are not diffused into the light-receiving surface, and the mask is removed after the formation of the impurity region 130.

Figure 6B:
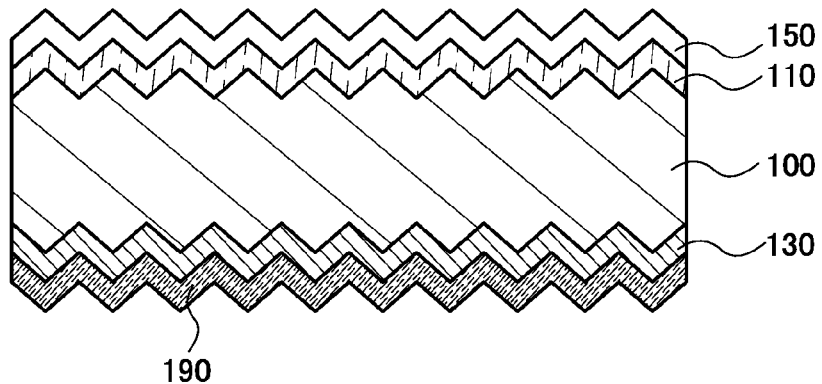

Next, the second electrode 190 is formed over the impurity region 130 (see FIG. 6B). The second electrode 190 can be formed using a low-resistance metal such as silver, aluminum, or copper by a sputtering method, a vacuum evaporation method, or the like. Alternatively, the second electrode 190 may be formed in such a manner that by a screen printing method, a conductive resin such as a silver paste or a copper paste is applied and baked.

Figure 6C:
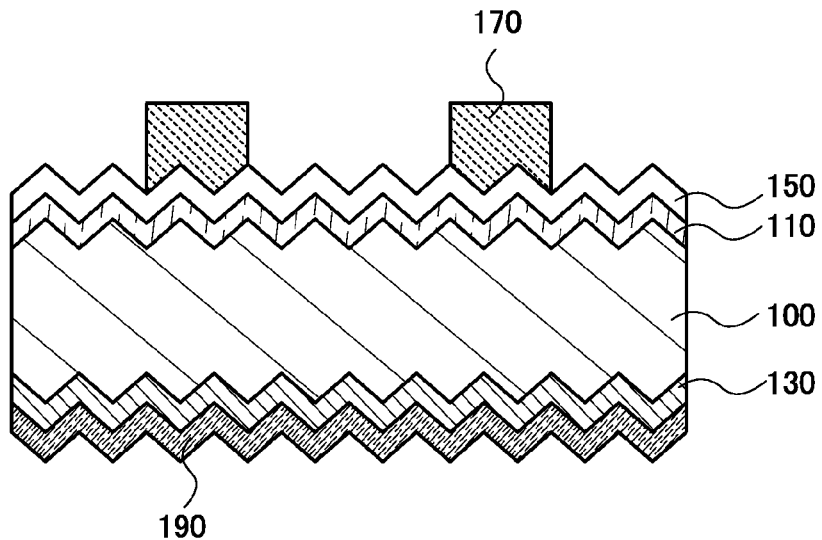

Next, the first electrode 170 is formed over the light-transmitting conductive film 150 (see FIG. 6C). The first electrode 170 is a grid electrode and is preferably formed in such a manner that a conductive resin such as a silver paste, a copper paste, a nickel paste, or a molybdenum paste is applied by a screen printing method and baked. Further, the first electrode 170 may be a stacked layer of different materials, such as a stacked layer of a silver paste and a copper paste. Further, the conductive resin may be applied by a dispensing method or an ink-jet method.

Note that in order to form a photoelectric conversion device having the structure illustrated in FIG. 2, before a process for forming unevenness, a resist mask or the like may be provided on a surface where the unevenness is not formed.

Further, in order to form a photoelectric conversion device having the structure illustrated in FIG. 3, a step for forming the light-transmitting conductive film 150 may be omitted.

Further, in order to form a photoelectric conversion device having the structure illustrated in FIG. 4, a silicon oxide film or a silicon nitride film may be provided as the passivation layer 180 having openings by a plasma CVD method or the like between the step of FIG. 5C and the step of FIG. 6A. Further, a light-transmitting semiconductor layer having a conductivity type opposite to the conductivity type of the light-transmitting semiconductor layer 110 may be provided by an evaporation method or a sputtering method.

In the above manner, the photoelectric conversion device in which the light-transmitting semiconductor layer is used as a window layer, which is one embodiment of the present invention, can be manufactured.

This embodiment can be freely combined with any of the other embodiments and an example.

[Embodiment 2]

In this embodiment, a photoelectric conversion device whose structure is different from the structures of the photoelectric conversion devices in Embodiment 1, and a method for manufacturing the photoelectric conversion device will be described. Note that detailed description of portions which are similar to those of Embodiment 1 is omitted in this embodiment.

Figure 7:
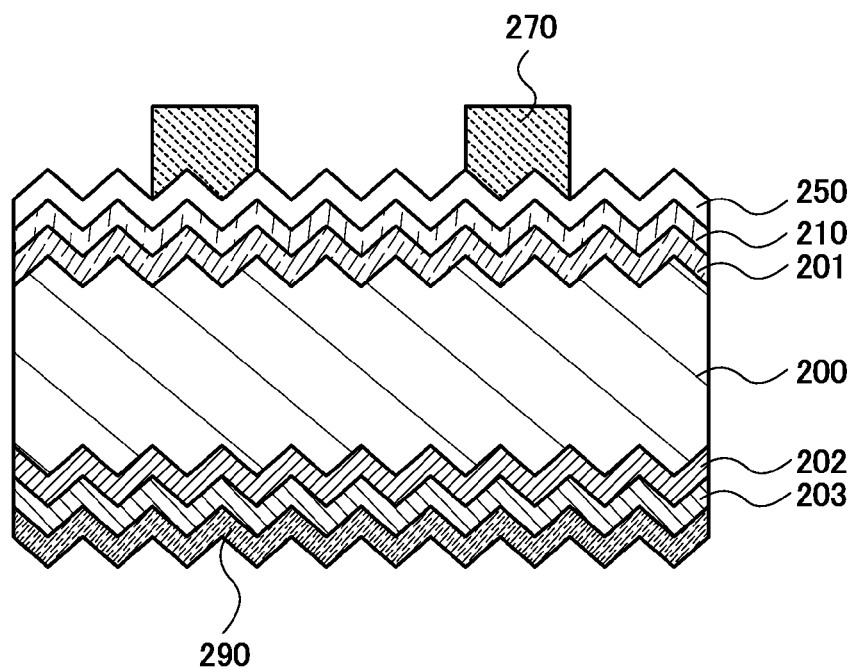
FIG. 7 is a cross-sectional view illustrating a photoelectric conversion device of one embodiment of the present invention.

FIG. 7 is a cross-sectional view of a photoelectric conversion device of one embodiment of the present invention. The photoelectric conversion device includes a silicon substrate 200 and further includes, over one surface of the silicon substrate, a first silicon semiconductor layer 201, a light-transmitting semiconductor layer 210, a light-transmitting conductive film 250, and a first electrode 270. Furthermore, the photoelectric conversion device includes, over the other surface of the silicon substrate, a second silicon semiconductor layer 202, a third silicon semiconductor layer 203, and a second electrode 290. Note that the first electrode 270 is a grid electrode, and a surface on the first electrode 270 side serves as a light-receiving surface.

Further, FIG. 7 illustrates an example in which a front surface and a back surface of the silicon substrate 200 are processed to have unevenness. On the surface processed to have unevenness, incident light is reflected in a multiple manner, and the light obliquely propagates into a photoelectric conversion region; thus, the optical path length is increased. In addition, a so-called light trapping effect in which reflected light by the back surface is totally reflected at the surface can occur.

Figure 8:
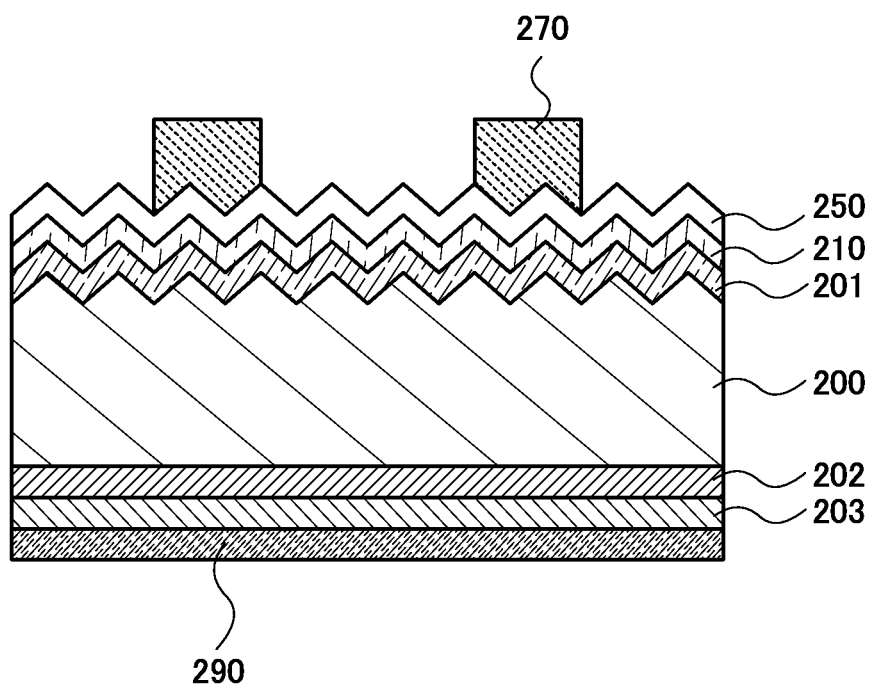
FIG. 8 is a cross-sectional view illustrating a photoelectric conversion device of one embodiment of the present invention.

Note that as illustrated in FIG. 8, a structure in which only one of surfaces (the front surface and the back surface of the silicon substrate 200) is processed to have unevenness may be employed. The surface area of the silicon substrate is increased by the unevenness; thus, while the optical effect described above can be obtained, the absolute amount of surface defects is increased. Therefore, in consideration of the balance between the optical effect and the amount of the surface defects, a practitioner may determine the structure so that more favorable electric characteristics can be obtained.

Figure 9:
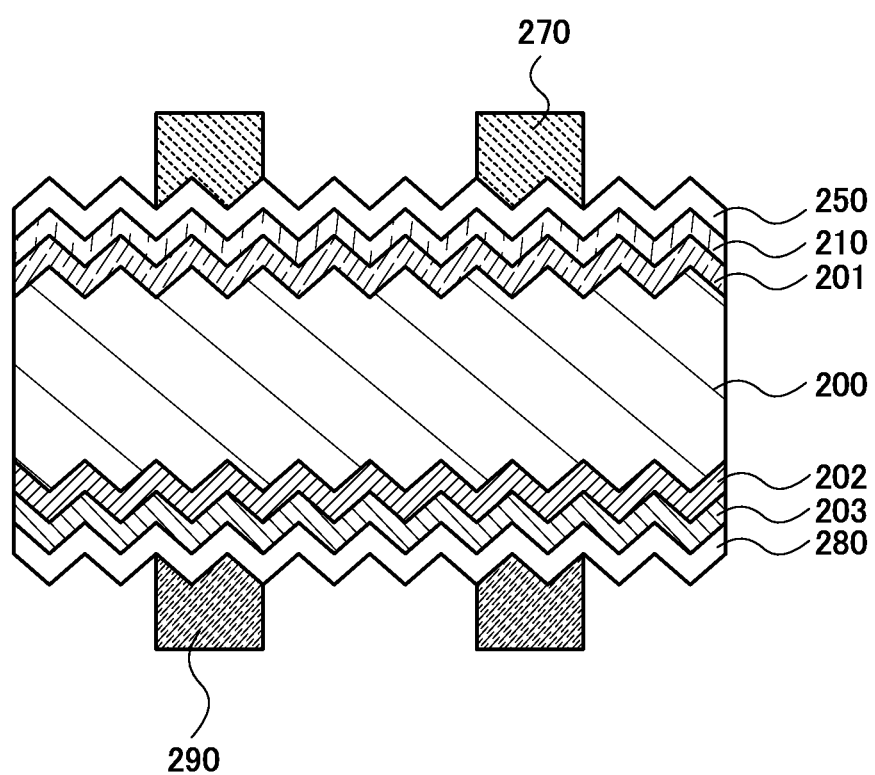
FIG. 9 is a cross-sectional view illustrating a photoelectric conversion device of one embodiment of the present invention.

Alternatively, as illustrated in FIG. 9, a structure in which the second electrode 290 is also a grid electrode and a light-transmitting conductive film 280 is provided between the third silicon semiconductor layer 203 and the second electrode 290 so that both surfaces of the silicon substrate 200 serve as light-receiving surfaces may be employed.

Figure 10:
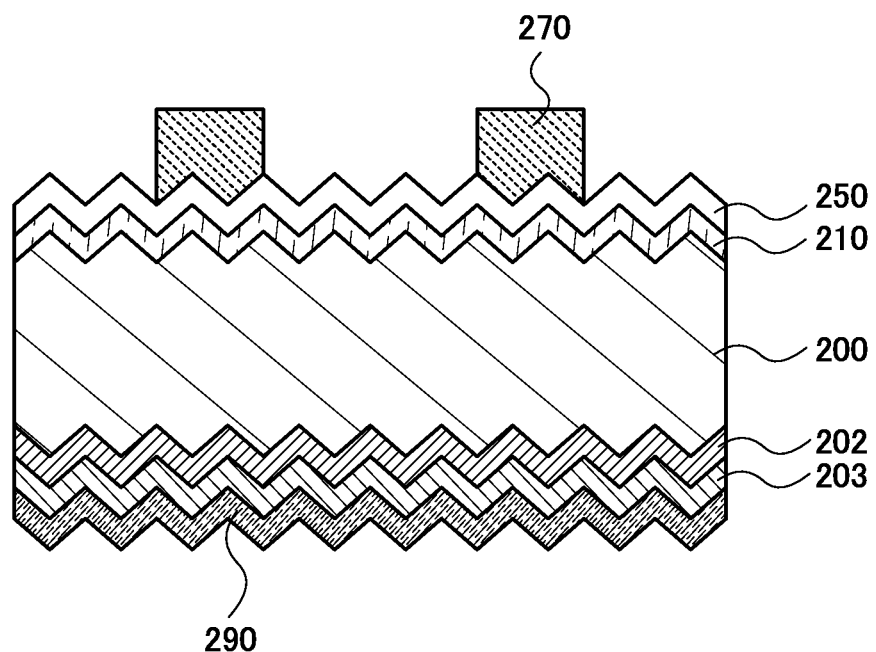
FIG. 10 is a cross-sectional view illustrating a photoelectric conversion device of one embodiment of the present invention.

Further, as illustrated in FIG. 10, a structure in which the first silicon semiconductor layer 201 is not provided and the silicon substrate 200 and the light-transmitting semiconductor layer 210 are in direct contact with each other may be employed. As described in Embodiment 1, the light-transmitting semiconductor layer of one embodiment of the present invention has a high passivation effect on the silicon surface, so that the light-transmitting semiconductor layer can be favorably bonded to the silicon substrate 200.

Further, an oxide layer may be provided between the first silicon semiconductor layer 201 and the light-transmitting semiconductor layer 210. For the oxide layer, silicon oxide ($SiO_x$ ($x>0$)), silicon dioxide ($SiO_2$), silicon monoxide (SiO), silicon oxide ($SiO_x$ ($x>0$)) in which silicon dioxide and silicon are mixed, and a compound of silicon, oxygen, and metal contained in the light-transmitting semiconductor layer can be used. The oxide layer can be obtained by oxidation or deposition using an electric furnace, a plasma CVD apparatus, a plasma treatment apparatus, or the like. Alternatively, the oxide layer may be formed in such a manner that the first silicon semiconductor layer 201 and the light-transmitting semiconductor layer 210 are reacted with each other using heat, infrared rays, or the like.

The thickness of the oxide layer can be 0.5 nm to 10 nm, preferably 0.5 nm to 5 nm. Since the oxide layer is interposed between the first silicon semiconductor layer 201 and the light-transmitting semiconductor layer 210, the oxide layer is preferably an extremely thin film through which tunnel current flows. The oxide layer is interposed between the first silicon semiconductor layer 201 and the light-transmitting semiconductor layer 210, whereby the first silicon semiconductor layer 201 and the light-transmitting semiconductor layer 210 can be favorably bonded to each other even when there is a lattice mismatch or the like.

Note that the photoelectric conversion device may have a structure in which structures of FIG. 7, FIG. 8, FIG. 9, and FIG. 10 are combined as appropriate.

As each of the first silicon semiconductor layer 201 and the second silicon semiconductor layer 202, a semiconductor layer containing hydrogen and few defects can be used, so that defects on the surface of the silicon substrate 200 can be reduced. The semiconductor layer is preferably formed using an amorphous silicon semiconductor.

As each of the first silicon semiconductor layer 201 and the second silicon semiconductor layer 202, for example, an i-type silicon semiconductor layer or a silicon semiconductor layer having a conductivity type opposite to that of the silicon substrate 200 can be used.

Note that in this specification, an "i-type semiconductor" refers not only to a so-called intrinsic semiconductor in which the Fermi level lies in the middle of the band gap, but also to a semiconductor in which the concentration of each of an impurity imparting p-type conductivity and an impurity imparting n-type conductivity is less than or equal to $1\times10^{18}$ cm$^{-3}$, and in which the photoconductivity is higher than the dark conductivity.

Further, in the case where a silicon semiconductor layer having a conductivity type opposite to that of the silicon substrate 200 is used as each of the first silicon semiconductor layer 201 and the second silicon semiconductor layer 202, a p$^-$-type or n$^-$-type silicon semiconductor layer is preferably used. In the case where a p$^-$-type silicon semiconductor layer is used, the semiconductor layer has a dark conductivity of $1\times10^{-10}$ S/cm to $1\times10^{-5}$ S/cm, preferably $1\times10^{-9}$ S/cm to $1\times10^{-6}$ S/cm, more preferably $1\times10^{-9}$ S/cm to $1\times10^{-7}$ S/cm. In the case where an n$^-$-type silicon semiconductor layer is used, the semiconductor layer has a dark conductivity of $1\times10^{-9}$ S/cm to $1\times10^{-4}$ S/cm, preferably $1\times10^{-8}$ S/cm to $1\times10^{-5}$ S/cm, more preferably $1\times10^{-8}$ S/cm to $1\times10^{-6}$ S/cm.

The silicon substrate 200 has one conductivity type, and the light-transmitting semiconductor layer 210 is a semiconductor layer having a conductivity type opposite to that of the silicon substrate 200. Thus, a p-n junction is formed between the silicon substrate 200 and the light-transmitting semiconductor layer 210 with the first silicon semiconductor layer 201 provided therebetween.

Further, the third silicon semiconductor layer 203 provided on the back surface of the silicon substrate 200 has the same conductivity type as the silicon substrate 200 and has a higher carrier concentration than the silicon substrate 200. Accordingly, an n-n$^+$ junction or a p-p$^+$ junction is formed between the silicon substrate 200 and the third silicon semiconductor layer 203 with the second silicon semiconductor layer 202 provided therebetween. In other words, the third silicon semiconductor layer 203 functions as a back surface field (BSF) layer. Minority carriers are repelled by the electric field of the n-n$^+$ junction or the p-p$^+$ junction and attracted to the p-n junction side, whereby recombination of carriers in the vicinity of the second electrode 290 can be prevented.

Note that in the case where the silicon substrate 200 has n-type conductivity, a light-transmitting conductive film having n-type conductivity may be used as an alternative to the third silicon semiconductor layer 203. For the light-transmitting conductive film, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene, or the like. The above light-transmitting conductive film is not limited to a single layer, and may be a stacked layer of different films may be employed. The light-transmitting conductive film serves not only as an electric field forming layer but also as a film for promoting reflection of light reaching the second electrode 290.

The light-transmitting semiconductor layer 210 of one embodiment of the present invention can be formed using the same material as the light-transmitting semiconductor layer 110 described in Embodiment 1. For example, an inorganic compound containing a metal oxide such as molybdenum oxide as its main component may be used.

In conventional photoelectric conversion devices, a window layer is formed using a silicon material; therefore, the light absorption in the window layer is a heavy loss in the conventional photoelectric conversion devices. In one embodiment of the present invention, a metal oxide having a light-transmitting property is used for a window layer of the photoelectric conversion device, whereby the light loss caused by light absorption in the window layer can be reduced, and photoelectric conversion can be efficiently performed in a light absorption region.

Next, a method for manufacturing the photoelectric conversion device illustrated in FIG. 7 will be described with reference to FIGS. 11A to 11C and FIGS. 12A to 12C.

A single crystal silicon substrate or a polycrystalline silicon substrate can be used for the silicon substrate 200 that can be used in one embodiment of the present invention. The manufacturing method and the conductivity type of the silicon substrate are not specifically limited. In this embodiment, an example in which an n-type single crystal silicon substrate whose surface corresponds to the (100) plane and which is manufactured by a magnetic Czochralski (MCZ) method is used will be described.

Figure 11A:
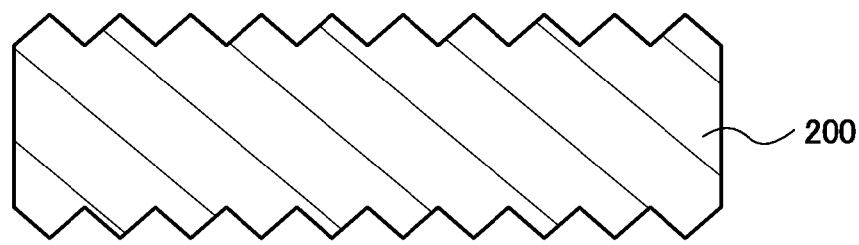
FIGS. 11A to 11C are cross-sectional views illustrating a process of a method for manufacturing a photoelectric conversion device of one embodiment of the present invention.

Next, the front surface and the back surface of the silicon substrate 200 are processed to have unevenness (see FIG. 11A). For a method for processing the silicon substrate 200 to have unevenness, the description of the step of processing the silicon substrate 100 to have unevenness in Embodiment 1, which is illustrated in FIG. 5A, can be referred to.

Next, after appropriate cleaning, the second silicon semiconductor layer 202 is formed over the back surface of the silicon substrate 200 which is on the side opposite to the light-receiving surface by a plasma CVD method. The thickness of the second silicon semiconductor layer 202 is preferably greater than or equal to 3 nm and less than or equal to 50 nm. In this embodiment, the second silicon semiconductor layer 202 is an i-type amorphous silicon, which has a film thickness of 5 nm. Note that microcrystalline silicon may be used for the second silicon semiconductor layer 202. The conductivity type of the second silicon semiconductor layer 202 is not limited to an i-type and may be an n$^-$-type.

The second silicon semiconductor layer 202 can be formed, for example, under the following conditions: monosilane is introduced to a reaction chamber at a flow rate of greater than or equal to 5 sccm and less than or equal to 200 sccm; the pressure inside the reaction chamber is higher than or equal to 100 Pa and lower than or equal to 200 Pa; the distance between electrodes is greater than or equal to 10 mm and less than or equal to 40 mm; the power density based on the area of a cathode electrode is greater than or equal to 8 mW/cm$^2$ and less than or equal to 120 mW/cm$^2$; and the substrate temperature is higher than or equal to 150° C. and lower than or equal to 300° C.

Figure 11B:
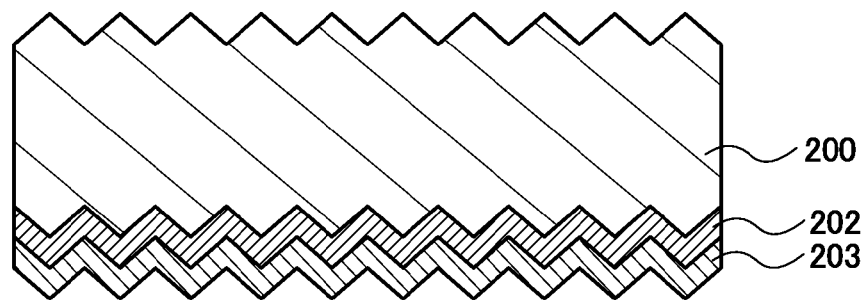

Next, the third silicon semiconductor layer 203 is formed over the second silicon semiconductor layer 202 (see FIG. 11B). The third silicon semiconductor layer 203 preferably has a thickness of greater than or equal to 3 nm and less than or equal to 50 nm. In this embodiment, the third silicon semiconductor layer 203 is formed using n$^+$-type microcrystalline silicon or amorphous silicon, and has a thickness of 10 nm.

The third silicon semiconductor layer 203 can be formed, for example, under the following conditions: monosilane and hydrogen-based phosphine (0.5%) are introduced to a reaction chamber at a flow rate ratio of 1:1 to 15; the pressure inside the reaction chamber is higher than or equal to 100 Pa and lower than or equal to 200 Pa; the distance between electrodes is greater than or equal to 10 mm and less than or equal to 40 mm; the power density based on the area of a cathode electrode is greater than or equal to 8 mW/cm$^2$ and less than or equal to 120 mW/cm²; and the substrate temperature is higher than or equal to 150° C. and lower than or equal to 300° C.

Figure 11C:
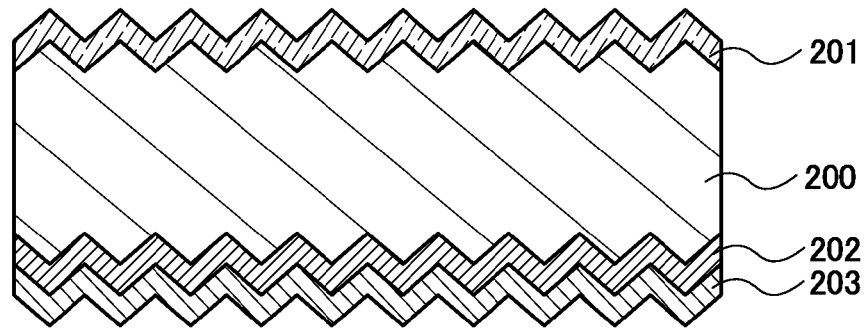

Next, the first silicon semiconductor layer 201 is formed over the surface of the silicon substrate 200 on the light-receiving surface side by a plasma CVD method (see FIG. 11C). The thickness of the first silicon semiconductor layer 201 is preferably greater than or equal to 3 nm and less than or equal to 50 nm. In this embodiment, the first silicon semiconductor layer 201 is an i-type amorphous silicon and has a thickness of 5 nm. Note that microcrystalline silicon may be used for the first silicon semiconductor layer 201. The conductivity type of the first silicon semiconductor layer 201 is not limited to an i-type and may be p⁻-type. Note that the first silicon semiconductor layer 201 can be formed under conditions similar to those of the third silicon semiconductor layer 203.

Note that in the case where the first silicon semiconductor layer 201 is a p⁻-type silicon semiconductor layer, the first silicon semiconductor layer 201 can be formed, for example, under the following conditions: monosilane and hydrogen-based diborane (0.1%) are introduced to a reaction chamber at a flow rate ratio of 1:0.01 to 1 (greater than or equal to 0.01 and less than 1); the pressure inside the reaction chamber is higher than or equal to 100 Pa and lower than or equal to 200 Pa; the distance between electrodes is greater than or equal to 10 mm and less than or equal to 40 mm; the power density based on the area of a cathode electrode is greater than or equal to 8 mW/cm² and less than or equal to 120 mW/cm²; and the substrate temperature is higher than or equal to 150° C. and lower than or equal to 300° C.

Note that in this embodiment, although an RF power source with a frequency of 13.56 MHz is used as a power source for forming the first silicon semiconductor layer 201, the second silicon semiconductor layer 202, and the third silicon semiconductor layer 203, an RF power source with a frequency of 27.12 MHz, 60 MHz, or 100 MHz may be used instead. In addition, the deposition may be carried out by not only continuous discharge but also pulse discharge. The implementation of pulse discharge can improve the film quality and reduce particles produced in the gas phase.

Figure 12A:
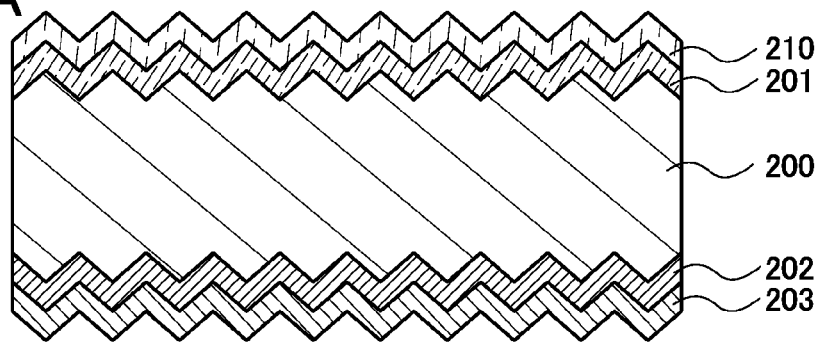
FIGS. 12A to 12C are cross-sectional views illustrating a process of a method for manufacturing a photoelectric conversion device of one embodiment of the present invention.

Next, the light-transmitting semiconductor layer 210 is formed over the first silicon semiconductor layer 201 (see FIG. 12A). For a method for forming the light-transmitting semiconductor layer 210, the description of the step of forming the light-transmitting semiconductor layer 110 in Embodiment 1, which is illustrated in FIG. 5B, can be referred to. In this embodiment, the light-transmitting semiconductor layer 210 is formed using molybdenum oxide having p-type conductivity and has a thickness of 10 nm to 100 nm.

Figure 12B:
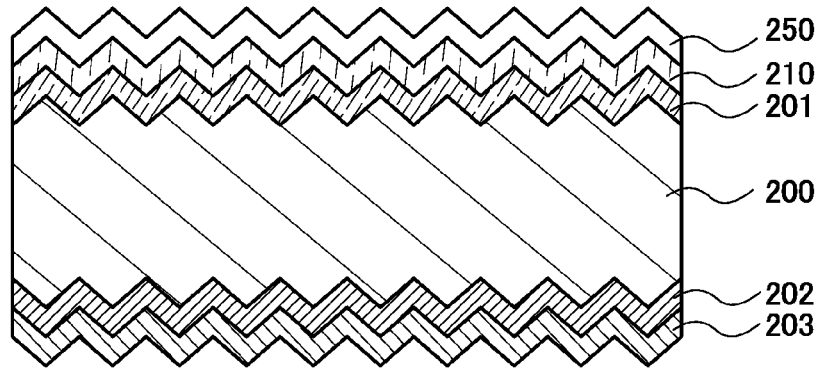

Next, the light-transmitting conductive film 250 is formed over the light-transmitting semiconductor layer 210 (see FIG. 12B). Here, the thickness of the light-transmitting conductive film 250 is preferably greater than or equal to 10 nm and less than or equal to 1000 nm. For a method for forming the light-transmitting conductive film 250, the description of the step of forming the light-transmitting conductive film 150 in Embodiment 1, which is illustrated in FIG. 5C, can be referred to. For example, the light-transmitting conductive film 250 is formed using indium tin oxide and has a thickness of 70 nm.

Note that the formation order of the films provided on the front surface and the back surface of the silicon substrate 200 is not limited to the order described above as long as the structure illustrated in FIG. 12B can be obtained. For example, the second silicon semiconductor layer 202 may be formed, and then the first silicon semiconductor layer 201 may be formed.

Next, the second electrode 290 is formed over the third silicon semiconductor layer 203. The second electrode 290 can be formed using a low-resistance metal such as silver, aluminum, or copper by a sputtering method, a vacuum evaporation method, or the like. Alternatively, the second electrode 290 may be formed using a conductive resin such as a silver paste or a copper paste by a screen printing method.

Figure 12C:
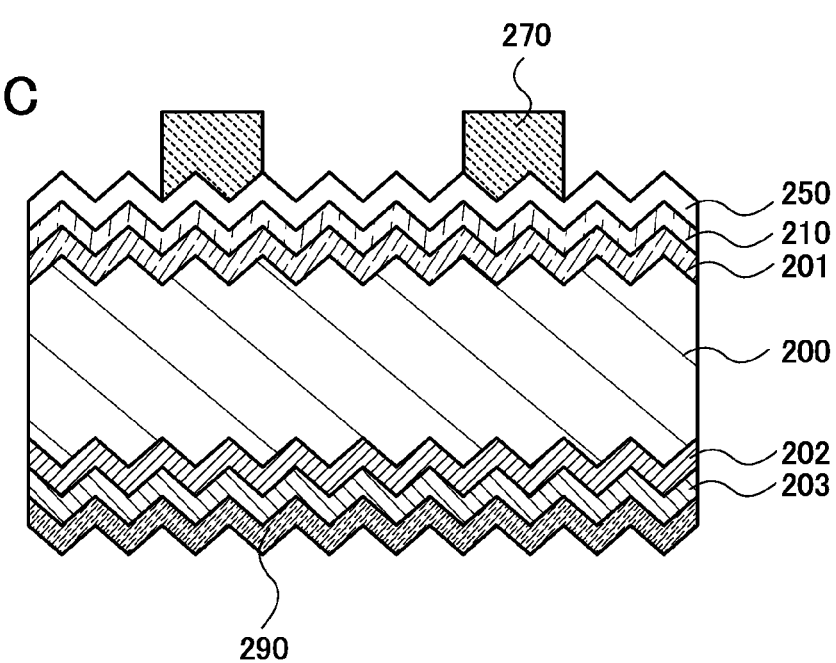

Next, the first electrode 270 is formed over the light-transmitting conductive film 250 (see FIG. 12C). The first electrode 270 is a grid electrode and is preferably formed using a conductive resin such as a silver paste, a copper paste, a nickel paste, or a molybdenum paste by a screen printing method. Further, the second electrode 290 may be a stacked layer of different materials, such as a stacked layer of a silver paste and a copper paste.

Note that in order to form a photoelectric conversion device having the structure illustrated in FIG. 8, before a process for forming unevenness, a resist mask or the like may be provided on a surface where the unevenness is not formed.

Further, in order to form a photoelectric conversion device having the structure illustrated in FIG. 9, in the step of FIG. 12B, the light-transmitting conductive film 280 may be formed over the third silicon semiconductor layer 203, and after that, as grid electrodes, the first electrode 270 and the second electrode 290 may be provided over the light-transmitting conductive film 250 and the light-transmitting conductive film 280, respectively.

Further, in order to form a photoelectric conversion device having the structure illustrated in FIG. 10, a structure in which the first silicon semiconductor layer is not provided in the step of FIG. 11C may be employed.

In the above manner, the photoelectric conversion device in which the light-transmitting semiconductor layer is used as a window layer, which is one embodiment of the present invention, can be manufactured.

This embodiment can be freely combined with any of the other embodiments and an example.

[Embodiment 3]

In this embodiment, a photoelectric conversion device using a thin film silicon semiconductor layer, which is one embodiment of the present invention, will be described.

Figure 17:
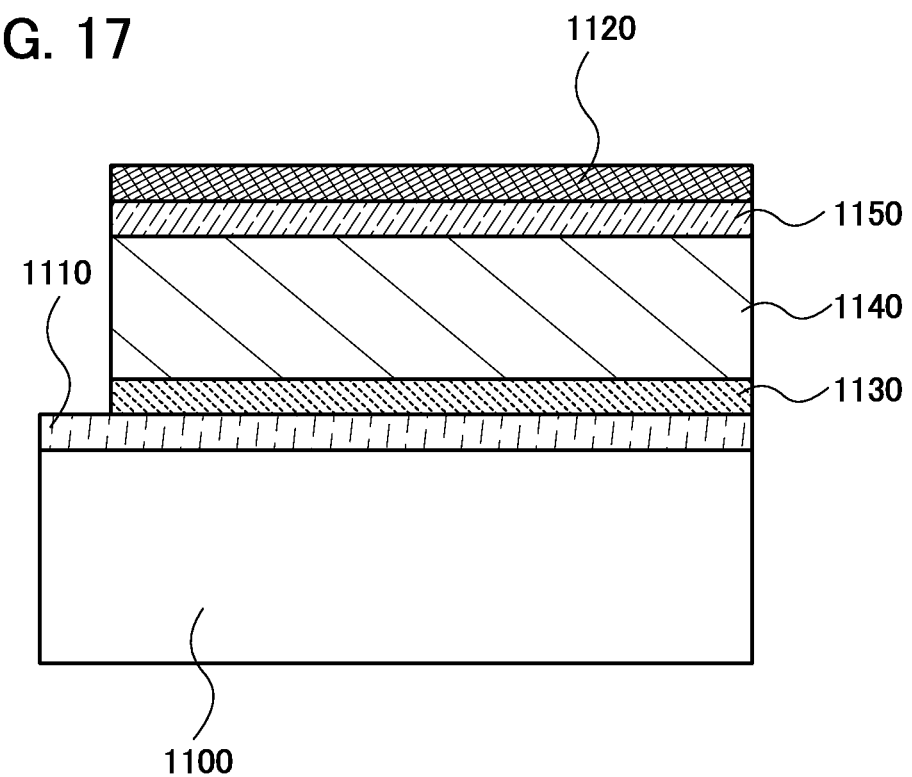
FIG. 17 is a cross-sectional view illustrating a photoelectric conversion device of one embodiment of the present invention.

FIG. 17 is a cross-sectional view of a photoelectric conversion device of one embodiment of the present invention, in which over a substrate 1100, a first electrode 1110 formed using a light-transmitting conductive film; a light-transmitting semiconductor layer 1130 formed using an inorganic compound; a first silicon semiconductor layer 1140; a second silicon semiconductor layer 1150; and a second electrode 1120 formed using metal or a conductive resin are stacked in this order. Although a light-receiving surface of the photoelectric conversion device in FIG. 17 is provided on the substrate 1100 side, the above order of stacking layers formed over the substrate 1100 may be reversed and a light-receiving surface may be provided on the side opposite to the substrate 1100.

Figure 18:
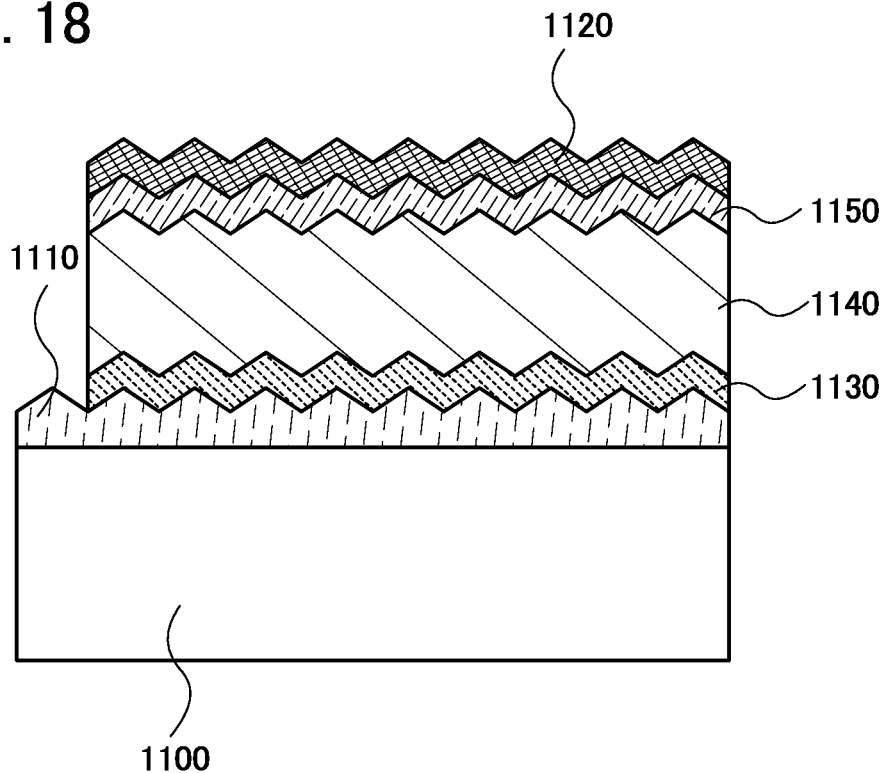
FIG. 18 is a cross-sectional view illustrating a photoelectric conversion device of one embodiment of the present invention.

Alternatively, as illustrated in FIG. 18, a surface of the first electrode 1110 may be uneven. By making the surface of the first electrode 1110 uneven, each interface of the layers stacked thereover also becomes uneven. The unevenness gives multiple reflection at the substrate surface, an increase in an optical path length in the photoelectric conversion layer, and the total-reflection effect (light trapping effect) in which reflected light by the back surface is totally reflected at the surface, so that the electric characteristics of the photoelectric conversion device can be improved.

Figure 19:
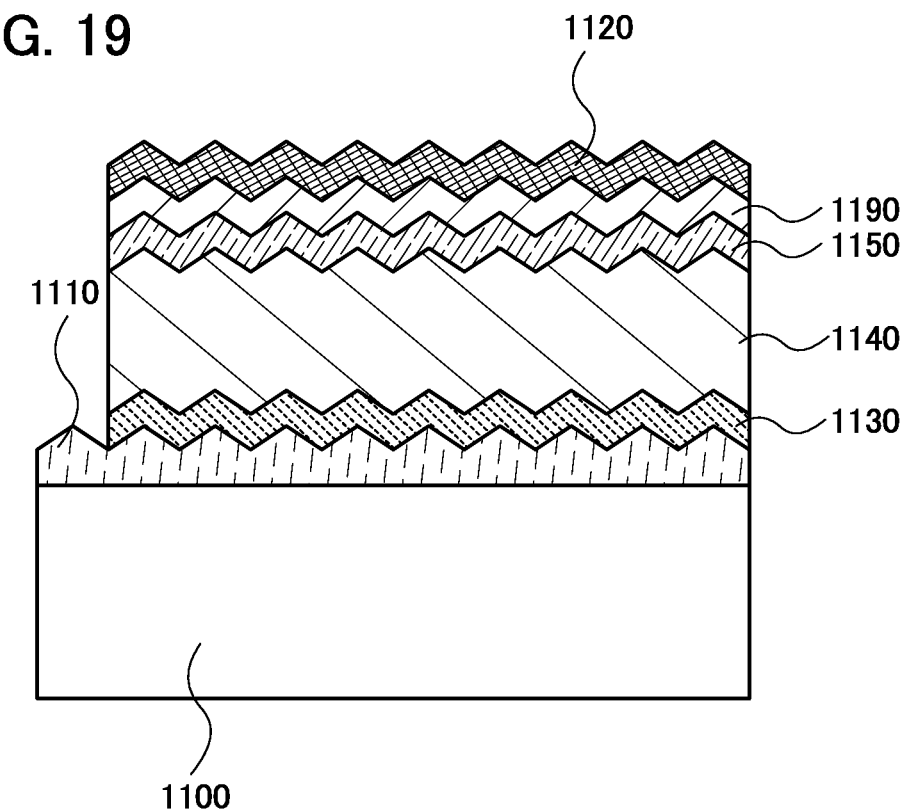
FIG. 19 is a cross-sectional view illustrating a photoelectric conversion device of one embodiment of the present invention.

Note that as illustrated in FIG. 19, a light-transmitting conductive film 1190 may be provided between the second electrode 1120 and the second silicon semiconductor layer 1150. By providing the light-transmitting conductive film, an interface having high birefringence is generated between the light-transmitting conductive film and the second electrode 1120; thus, the reflectance can be improved, so that a substantial optical path length in the first silicon semiconductor layer which is a light absorption layer can be lengthened. Here, the thickness of the light-transmitting conductive film is preferably greater than or equal to 10 nm and less than or equal to 100 nm.

Note that the photoelectric conversion device may have a structure in which structures of FIG. 17 and FIG. 18 are combined as appropriate or a structure in which structures of FIG. 17 and FIG. 19 are combined as appropriate.

For the substrate 1100, a glass plate of general flat glass, clear flat glass, lead glass, crystallized glass, or the like can be used, for example. Alternatively, a non-alkali glass substrate of aluminosilicate glass, barium borosilicate glass, aluminoborosilicate glass, or the like, or a quartz substrate can be used. In this embodiment, a glass substrate is used as the substrate 1100.

Alternatively, a resin substrate can be used as the substrate 1100. For example, the following can be given: polyether sulfone (PES); polyethylene terephthalate (PET); polyethylene naphthalate (PEN); polycarbonate (PC); a polyamide-based synthetic fiber; polyether etherketone (PEEK); polysulfone (PSF); polyether imide (PEI); polyarylate (PAR); polybutylene terephthalate (PBT); polyimide; an acrylonitrile butadiene styrene resin; poly vinyl chloride; polypropylene; poly vinyl acetate; an acrylic resin, and the like.

For the first electrode 1110 and the light-transmitting conductive film 1190, for example, a light-transmitting conductive film including an indium tin oxide, an indium tin oxide containing silicon, an indium oxide containing zinc, a zinc oxide, a zinc oxide containing gallium, a zinc oxide containing aluminum, a tin oxide, a tin oxide containing fluorine, or a tin oxide containing antimony, etc. can be used. The above light-transmitting conductive film is not limited to a single layer and may be a stacked layer of different films. For example, a stacked layer of an indium tin oxide and a zinc oxide containing aluminum, a stacked layer of an indium tin oxide and a tin oxide containing fluorine, etc. can be used. The total thickness is preferably greater than or equal to 10 nm and less than or equal to 1000 nm.

For the second electrode 1120, a metal film of aluminum, titanium, nickel, silver, molybdenum, tantalum, tungsten, chromium, copper, stainless steel, or the like can be used. The metal film is not limited to a single layer and may be a stacked layer of different films. For example, a stacked layer of a stainless steel film and an aluminum film, a stacked layer of a silver film and an aluminum film, or the like can be used. The metal film can be formed by a sputtering method or the like, and the total thickness is greater than or equal to 100 nm and less than or equal to 600 nm, preferably greater than or equal to 100 nm and less than or equal to 300 nm.

Further, the second electrode 1120 may be formed using a conductive resin such as a silver paste, a copper paste, a nickel paste, or a molybdenum paste. Further, the second electrode 1120 may be a stacked layer of different materials, such as a stacked layer of a silver paste and a copper paste. The second electrode 1120 can be formed in such a manner that by a screen printing method, a dispensing method, an ink-jet method or the like, a conductive resin is applied and baked.

For the light-transmitting semiconductor layer 1130, it is possible to use an inorganic compound containing, as its main component, a transition metal oxide having a band gap of greater than or equal to 2 eV, preferably greater than or equal to 2.5 eV. It is particularly preferable that an inorganic compound containing, as its main component, an oxide of a metal belonging to any of Groups 4 to 8 in the periodic table be used. The oxide of the metal has a high light-transmitting property with respect to light in a wavelength range which is absorbed by silicon.

Specifically, as the metal oxide, vanadium oxide, niobium oxide, tantalum oxide, chromium oxide, molybdenum oxide, tungsten oxide, manganese oxide, rhenium oxide, or the like can be used. Among these metal oxides, molybdenum oxide is especially preferable since it is stable in the air, has a low hygroscopic property, and is easily handled.

Further, an impurity is added to the metal oxide, whereby the conductivity type can be changed. Furthermore, in the case where an impurity is not intentionally added to the metal oxide, a defect in the metal oxide, an oxygen defect in the metal oxide, and a slight amount of an impurity introduced into the metal oxide cause the formation of a donor level or an acceptor level, so that the metal oxide exhibits n-type or p-type conductivity in some cases.

For the first silicon semiconductor layer 1140, an i-type silicon semiconductor can be used. Note that in this specification, an "i-type semiconductor" refers not only to a so-called intrinsic semiconductor in which the Fermi level lies in the middle of the band gap, but also to a semiconductor in which the concentration of each of an impurity imparting p-type conductivity and an impurity imparting n-type conductivity is less than or equal to $1 \times 10^{18}$ cm$^{-3}$, and in which the photoconductivity is higher than the dark conductivity.

For the i-type silicon semiconductor used in the first silicon semiconductor layer 1140, it is preferable to use non-single-crystal silicon, amorphous silicon, microcrystalline silicon, or polycrystalline silicon. Amorphous silicon has a peak of spectral sensitivity in the visible light region; thus, with use of amorphous silicon, a photoelectric conversion device having a high photoelectric conversion ability in an environment with low illuminance such as a place under a fluorescent lamp can be formed. On the other hand, microcrystalline silicon and polycrystalline silicon can absorb light in a longer wavelength range than the visible light region; thus, a photoelectric conversion device having a high photoelectric conversion ability in an outdoor environment where solar light is used as a light source can be formed.

In the case where amorphous silicon is used for the first silicon semiconductor layer 1140, the thickness thereof is preferably greater than or equal to 100 nm and less than or equal to 600 nm. In the case where microcrystalline silicon or polycrystalline silicon is used for the first silicon semiconductor layer 1140, the thickness thereof is preferably greater than or equal to 1 μm and less than or equal to 100 μm. Note that an i-type silicon semiconductor can be formed using silane or disilane as a source gas by a plasma CVD method or the like.

Further, an oxide layer may be provided between the first silicon semiconductor layer 1140 and the light-transmitting semiconductor layer 1130. For the oxide layer, silicon oxide (SiO$_x$ (x>0)), silicon dioxide (SiO$_2$), silicon monoxide (SiO), silicon oxide (SiO$_x$ (x>0)) in which silicon dioxide and silicon are mixed, and a compound of silicon, oxygen, and metal contained in the light-transmitting semiconductor layer can be used. The oxide layer can be obtained by oxidation or deposition using an electric furnace, a plasma CVD apparatus, a plasma treatment apparatus, or the like. Alternatively, the oxide layer may be formed in such a manner that the first silicon semiconductor layer 1140 and the light-transmitting semiconductor layer 1130 are reacted with each other using heat, infrared rays, or the like.

The thickness of the oxide layer can be 0.5 nm to 10 nm, preferably 0.5 nm to 5 nm. Since the oxide layer is interposed between the first silicon semiconductor layer 1140 and the light-transmitting semiconductor layer 1130, the oxide layer is preferably an extremely thin film through which tunnel current flows. The oxide layer is interposed between the first silicon semiconductor layer 1140 and the light-transmitting semiconductor layer 1130, whereby the first silicon semiconductor layer 1140 and the light-transmitting semiconductor layer 1130 can be favorably bonded to each other even when there is a lattice mismatch or the like.

For the second silicon semiconductor layer 1150, a silicon semiconductor film having a conductivity type opposite to that of the light-transmitting semiconductor layer 1130, that is, an n-type or p-type silicon semiconductor film is used. The thickness of the second silicon semiconductor layer 1150 is preferably greater than or equal to 3 nm and less than or equal to 50 nm. Further, although amorphous silicon can be used for the second silicon semiconductor layer 1150, microcrystalline silicon or polycrystalline silicon that has lower resistance than amorphous silicon is preferably used.

Note that an n-type silicon semiconductor film can be formed using a source gas into which a doping gas containing an impurity imparting n-type conductivity is mixed by a plasma CVD method. As the impurity imparting n-type conductivity, typically, phosphorus, arsenic, or antimony which is an element belonging to Group 15 in the periodic table, or the like is given. Further, a p-type silicon semiconductor film can be formed using a source gas into which a doping gas containing an impurity imparting p-type conductivity is mixed by a plasma CVD method. As the impurity imparting p-type conductivity, typically, boron, aluminum, gallium, or the like which is an element belonging to Group 13 in the periodic table, or the like is given.

As described above, the p-type or n-type light-transmitting semiconductor layer 1130, the i-type first silicon semiconductor layer 1140, and the second silicon semiconductor layer 1150 having a conductivity type opposite to that of the light-transmitting semiconductor layer 1130 are stacked, whereby the photoelectric conversion device in which the light-transmitting semiconductor layer is used as a window layer, which is one embodiment of the present invention, can be manufactured.

In conventional photoelectric conversion devices, amorphous silicon or microcrystalline silicon whose resistance is lowered by addition of impurities, or the like is used for a window layer; thus, the window layer has a light absorption property equivalent to that of the light absorption layer. Although photo-carriers are generated in the window layer, the lifetime of minority carrier is short and the carriers cannot be taken out as current. Thus, the light absorption in the window layer is a heavy loss in the conventional photoelectric conversion devices.

In one embodiment of the present invention, the light-transmitting semiconductor layer formed using an inorganic compound is used as a window layer, whereby the light loss due to light absorption in the window layer is reduced and photoelectric conversion can be efficiently performed in the i-type light absorption layer. In addition, as described above, the light-transmitting semiconductor layer has extremely a high passivation effect on the silicon surface. Accordingly, the photoelectric conversion efficiency of the photoelectric conversion device can be improved.

This embodiment can be freely combined with any of other embodiments.

[Embodiment 4]

In this embodiment, photoelectric conversion devices whose structures are different from the structures of the photoelectric conversion devices in Embodiment 3 will be described. Note that detailed description of portions which are similar to those of Embodiment 3 is omitted in this embodiment.

Figure 20:
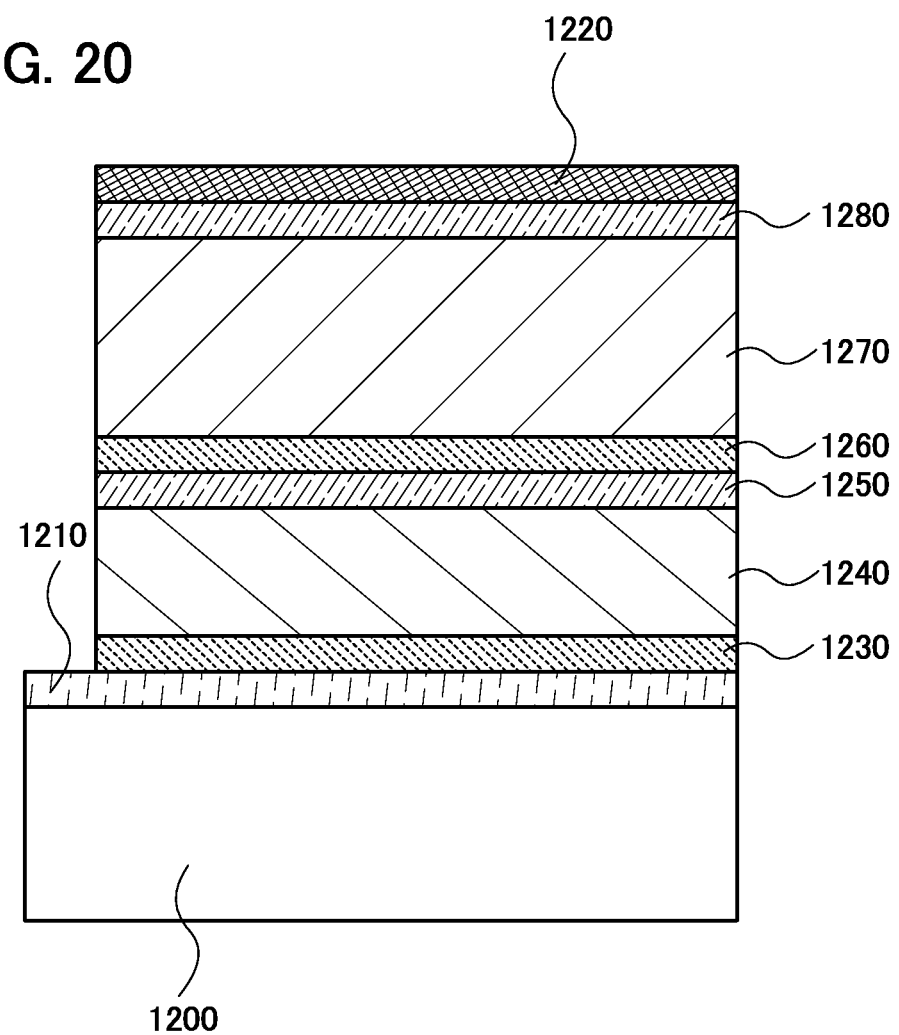
FIG. 20 is a cross-sectional view illustrating a photoelectric conversion device of one embodiment of the present invention.

FIG. 20 is a cross-sectional view of a photoelectric conversion device of one embodiment of the present invention. The photoelectric conversion device includes, over a substrate 1200, a first electrode 1210 formed using a light-transmitting conductive film; a first light-transmitting semiconductor layer 1230 formed using an inorganic compound; a first silicon semiconductor layer 1240; a second silicon semiconductor layer 1250; a second light-transmitting semiconductor layer 1260 formed using an inorganic compound; a third silicon semiconductor layer 1270; a fourth silicon semiconductor layer 1280; and a second electrode 1220 formed using metal or a conductive resin. Although a light-receiving surface of the photoelectric conversion device in FIG. 20 is provided on the substrate 1200 side, the above order of stacking layers formed over the substrate 1200 may be reversed and a light-receiving surface may be provided on the side opposite to the substrate 1200.

The photoelectric conversion device having the above structure is a so-called tandem photoelectric conversion device in which a top cell where the first silicon semiconductor layer 1240 functions as a light absorption layer and a bottom cell where the third silicon semiconductor layer 1270 functions as a light absorption layer are connected in series.

Figure 21:
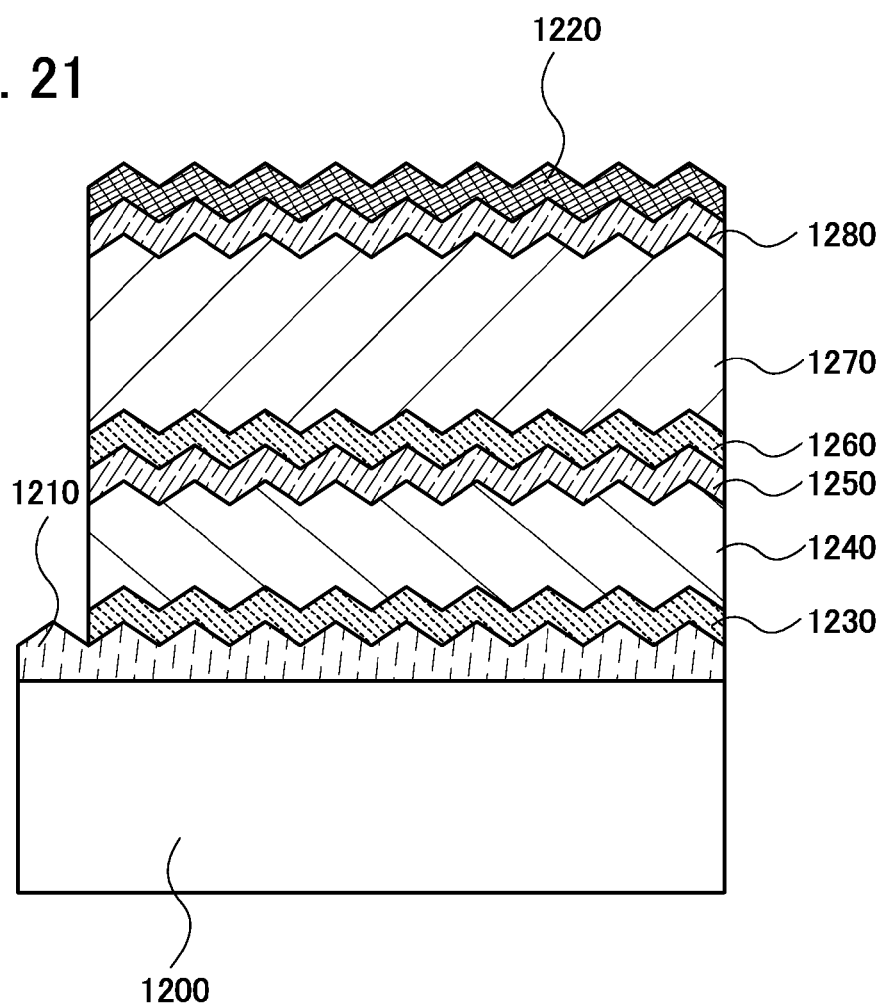
FIG. 21 is a cross-sectional view illustrating a photoelectric conversion device of one embodiment of the present invention.

Alternatively, as illustrated in FIG. 21, a surface of the first electrode 1210 may be uneven. By making the surface of the first electrode 1210 uneven, each interface of layers stacked thereover also becomes uneven. The unevenness gives multiple reflection at the substrate surface, an increase in an optical path length in the photoelectric conversion layer, and the total-reflection effect (light trapping effect) in which reflected light by the back surface is totally reflected at the surface, so that the electric characteristics of the photoelectric conversion device can be improved.

Figure 22:
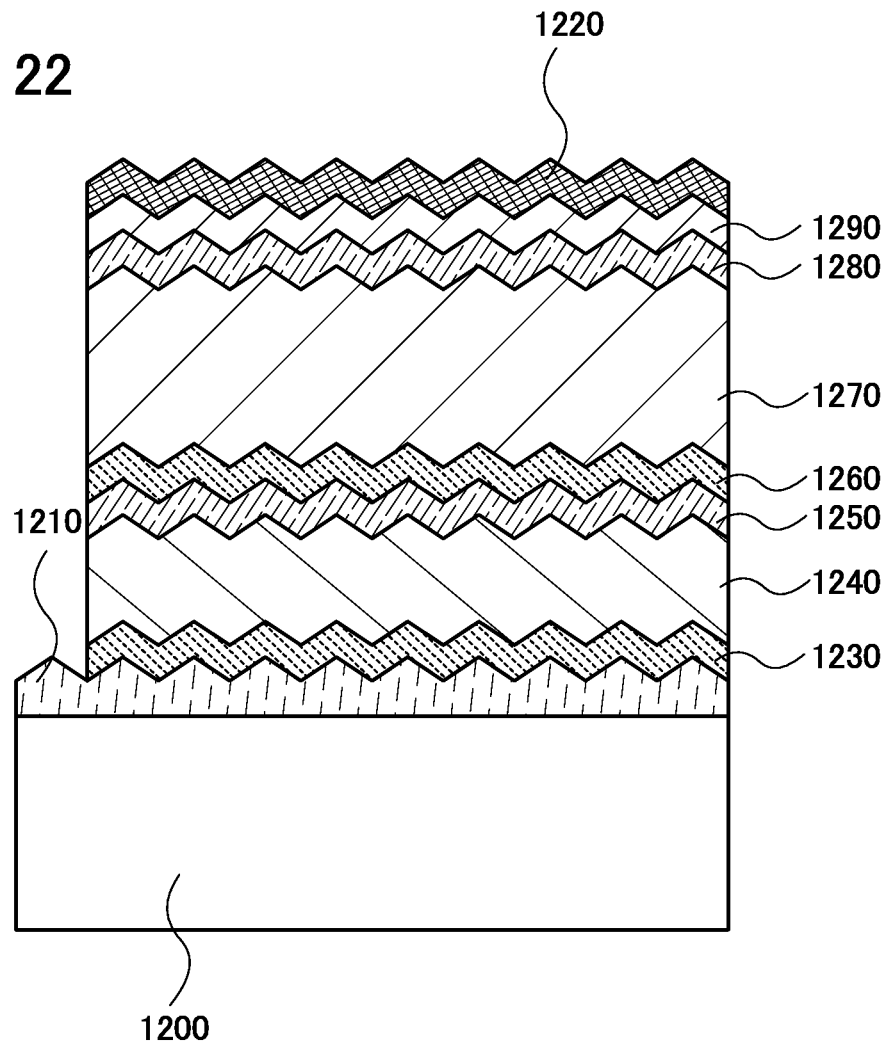
FIG. 22 is a cross-sectional view illustrating a photoelectric conversion device of one embodiment of the present invention.

Note that as illustrated in FIG. 22, a light-transmitting conductive film 1290 may be provided between the second electrode 1220 and the fourth silicon semiconductor layer 1280. By providing the light-transmitting conductive film, an interface having high birefringence is generated between the light-transmitting conductive film and the second electrode 1220; thus, the reflectance can be improved, so that a substantial optical path length in the first silicon semiconductor layer which is a light absorption layer can be lengthened. Here, the thickness of the light-transmitting conductive film is preferably greater than or equal to 10 nm and less than or equal to 100 nm.

Further, oxide layers may be provided between the first silicon semiconductor layer 1240 and the first light-transmitting semiconductor layer 1230 and between the third silicon semiconductor layer 1270 and the second light-transmitting semiconductor layer 1260. For the oxide layers, silicon oxide ($SiO_x$ (x>0)), silicon dioxide ($SiO_2$), silicon monoxide (SiO), silicon oxide (SiO, (x>0)) in which silicon dioxide and silicon are mixed, and a compound of silicon, oxygen, and metal contained in the light-transmitting semiconductor layer can be used. The oxide layers can be obtained by oxidation or deposition using an electric furnace, a plasma CVD apparatus, a plasma treatment apparatus, or the like. Alternatively, the oxide layers may be formed in such a manner that, using heat, infrared rays, or the like, the first silicon semiconductor layer 1240 and the first light-transmitting semiconductor layer 1230 are reacted with each other, and the third silicon semiconductor layer 1270 and the second light-transmitting semiconductor layer 1260 are reacted with each other.

The thickness of the oxide layer can be 0.5 nm to 10 nm, preferably 0.5 nm to 5 nm. Since the oxide layers are interposed between the first silicon semiconductor layer 1240 and the first light-transmitting semiconductor layer 1230 and between the third silicon semiconductor layer 1270 and the second light-transmitting semiconductor layer 1260, each of the oxide layers is preferably an extremely thin film through which tunnel current flows. The oxide layers are interposed between the first silicon semiconductor layer 1240 and the first light-transmitting semiconductor layer 1230 and between the third silicon semiconductor layer 1270 and the second light-transmitting semiconductor layer 1260, whereby even when there is a lattice mismatch or the like, the first silicon semiconductor layer 1240 and the first light-transmitting semiconductor layer 1230 can be favorably bonded to each other, and the third silicon semiconductor layer 1270 and the second light-transmitting semiconductor layer 1260 can be favorably bonded to each other.

Note that the photoelectric conversion device may have a structure in which structures of FIG. 20 and FIG. 21 are combined as appropriate or a structure in which structures of FIG. 20 and FIG. 22 are combined as appropriate.

In the photoelectric conversion device described above, i-type amorphous silicon is used for the first silicon semiconductor layer 1240, and i-type microcrystalline silicon or i-type polycrystalline silicon is used for the third silicon semiconductor layer 1270.

When light enters the top cell through the first electrode 1210 from the substrate 1200 side, light which is mainly in the visible light region or on the shorter wavelength side than the visible light region is converted into electric energy in the first silicon semiconductor layer 1240 which is a light absorption layer formed using amorphous silicon. Then, light which is mainly on the longer wavelength side than the visible light region and has passed through the top cell is converted into electric energy in the third silicon semiconductor layer 1270 which is a light absorption layer formed using microcrystalline silicon or polycrystalline silicon. Therefore, light with a wide wavelength range can be effectively utilized, and the conversion efficiency of the photoelectric conversion device can be improved.

Note that the photoelectric conversion device in this embodiment can be formed using the same material as the photoelectric conversion devices in Embodiment 3. For example, the substrate 1200, the first electrode 1210, the first light-transmitting semiconductor layer 1230, the second silicon semiconductor layer 1250, and the second electrode 1220 in FIG. 20 can be formed using the same materials as the substrate 1100, the first electrode 1110, the light-transmitting semiconductor layer 1130, the second silicon semiconductor layer 1150, and the second electrode 1120 in FIG. 17, respectively.

Further, the second light-transmitting semiconductor layer 1260, the fourth silicon semiconductor layer 1280, and the light-transmitting conductive film 1290 in FIG. 22 can be formed using the same materials as the first light-transmitting semiconductor layer 1230, the second silicon semiconductor layer 1250, and the first electrode 1210 in FIG. 22, respectively.

This embodiment can be freely combined with any of other embodiments.

(Embodiment 5)

In this embodiment, a method for manufacturing the photoelectric conversion devices described in Embodiments 3 and 4 will be described.

Note that in this embodiment, a method for manufacturing an integrated photoelectric conversion device in which a plurality of photoelectric conversion devices of FIG. 17 is connected in series, and a method for manufacturing an integrated photoelectric conversion device in which a plurality of photoelectric conversion devices of FIG. 20 is connected in series will be described. In the case of manufacturing a photoelectric conversion device which is not integrated, a process of integration is omitted.

A method for manufacturing a photoelectric conversion device in which photoelectric conversion devices each having a structure of FIG. 17 are integrated will be described.

First, a light-transmitting conductive film serving as the first electrode 1110 is formed over the substrate 1100. Here, an indium tin oxide (ITO) film with a thickness of 70 nm is formed by a sputtering method. Note that unevenness of the light-transmitting conductive film illustrated in FIG. 18 can be easily formed in such a manner that, for example, a zinc-oxide-based light-transmitting conductive film is formed and etched using strong acid such as hydrochloric acid.

Although a glass substrate is used as the substrate 1100 in this embodiment, if a resin substrate with a thickness of about 100 μm for example is used, roll-to-roll processing can be performed.

In roll-to-roll processing, in addition to a film formation step by a sputtering method, a plasma CVD method, or the like, a step by a screen printing method, a laser processing method, or the like is included. Accordingly, almost the entire manufacturing process of a photoelectric conversion device can be performed by roll-to-roll processing. Alternatively, some of steps for the manufacturing process may be performed with roll-to-roll processing; a step of division into sheet forms may be performed; and the latter steps for the manufacturing step may be individually performed for each sheet. For example, by attaching each piece of the divided sheet to a frame that is formed of ceramic, metal, a composite body thereof, or the like, it can be handled in the same manner as a glass substrate or the like.

Figure 23A:
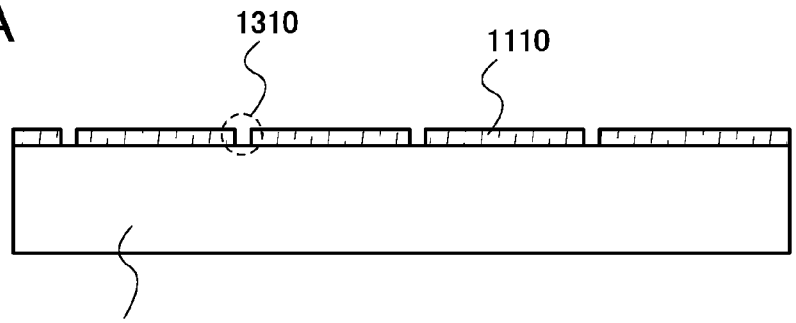
FIGS. 23A to 23D are cross-sectional views illustrating a process of a method for manufacturing a photoelectric conversion device of one embodiment of the present invention.

Next, a first isolation groove 1310 which divides the light-transmitting conductive film into a plurality of pieces is formed (see FIG. 23A). The isolation groove can be formed by laser processing or the like. As a laser used for this laser processing, a continuous wave laser or a pulsed laser which emits light in a visible light region or an infrared light region is preferably used. For example, a fundamental wave (wavelength: 1064 nm) or a second harmonic (wavelength: 532 nm) of an Nd-YAG laser can be used. Note that here, a portion of the isolation groove may reach the substrate 1100. Also, the light-transmitting conductive film is divided in this step, whereby the first electrode 1110 is formed.

Next, the light-transmitting semiconductor layer 1130 is formed over the first electrode 1110 and the first isolation groove 1310. For the light-transmitting semiconductor layer 1130, the metal oxide described in Embodiment 3 can be used. In this embodiment, an example in which a p-type molybdenum oxide film is formed will be described.

The p-type molybdenum oxide film can be formed by a vapor phase method such as an evaporation method, a sputtering method, or an ion plating method. In an evaporation method, a material of molybdenum oxide alone may be evaporated, or a material of molybdenum oxide and an impurity imparting p-type conductivity may be co-evaporated. Note that the co-evaporation refers to an evaporation method in which evaporation is carried out from a plurality of evaporation sources at the same time in one treatment chamber. In a sputtering method, molybdenum oxide, molybdenum trioxide, molybdenum dioxide, molybdenum, or a material containing an impurity imparting p-type conductivity thereto may be used as a target, and oxygen or a mixed gas of oxygen and a rare gas such as argon may be used as a sputtering gas. In an ion plating method, a film may be formed in plasma containing oxygen with the use of a material similar to the material used in the sputtering method.

In this embodiment, a method in which a material of molybdenum oxide alone is evaporated is used. As an evaporation source, powder of molybdenum oxide can be used. The purity of the powder of molybdenum oxide is preferably 99.99% (4N) to 99.999% (6N). The evaporation is preferably performed in a high vacuum of $5\times10^{-3}$ Pa or less, preferably $1\times10^{-4}$ Pa or less.

Next, by a plasma CVD method, an i-type amorphous silicon film is formed with a thickness of 400 nm as the first silicon semiconductor layer 1140. As a source gas, silane or disilane can be used, and hydrogen may be added thereto. At this time, an atmospheric component contained in the film serves as a donor in some cases; thus, boron (B) may be added to the source gas so that the conductivity type is closer to i-type. In this case, the concentration of boron in the i-type amorphous silicon is made to be higher than or equal to 0.001 at. % and lower than or equal to 0.1 at. %.

Figure 23B:
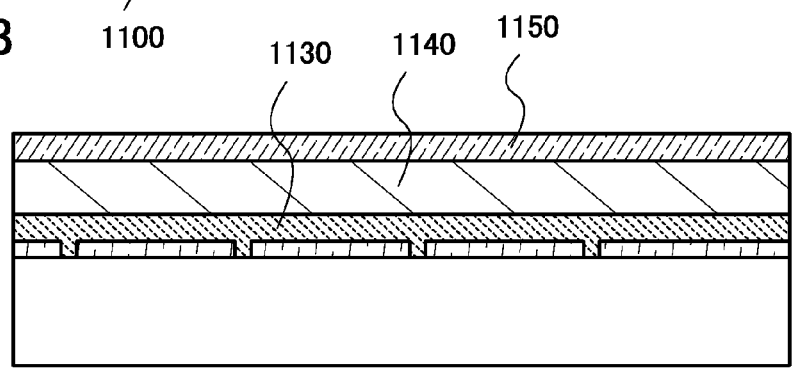

Next, as the second silicon semiconductor layer 1150, a 30-nm-thick n-type microcrystalline silicon layer is formed (see FIG. 23B). In this embodiment, a doping gas containing an impurity imparting n-type conductivity is mixed into a source gas, and an n-type microcrystalline silicon film is formed by a plasma CVD method. As the impurity imparting n-type conductivity, typically, phosphorus, arsenic, or antimony which is an element belonging to Group 15 in the periodic table, or the like is given. For example, a doping gas such as phosphine is mixed into a source gas such as silane, so that an n-type microcrystalline silicon film can be formed. Note that although the second silicon semiconductor layer 1150 may be formed using amorphous silicon, it is preferably formed using microcrystalline silicon which has lower resistance.

Figure 23C:
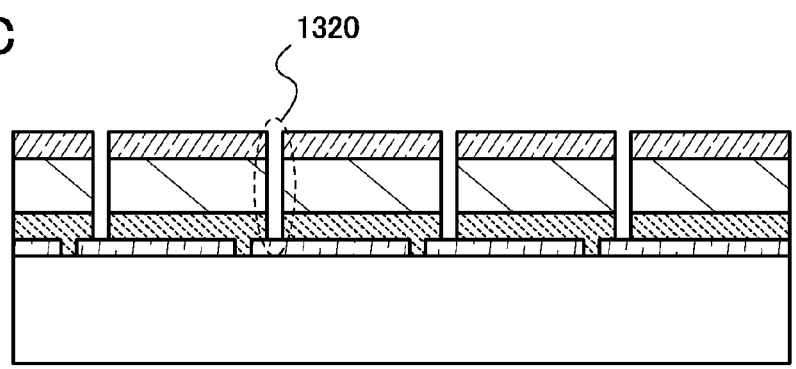

Next, a second isolation groove 1320 which divides a stacked layer of the light-transmitting semiconductor layer 1130, the first silicon semiconductor layer 1140, and the second silicon semiconductor layer 1150 into a plurality of pieces is formed (see FIG. 23C). The isolation groove can be formed by laser processing or the like. As a laser used in this laser processing, a continuous wave laser or a pulsed laser which emits light in a visible light region is preferably used. For example, a second harmonic (wavelength: 532 nm) or the like of an Nd-YAG laser can be used. Further, the isolation groove may divide the first electrode 1110 and reach the substrate 1100. Note that in the case where the light-transmitting conductive film 1190 is provided as illustrated in FIG. 19, the light-transmitting conductive film 1190 may be formed over the second silicon semiconductor layer 1150 before the second isolation groove 1320 is formed.

Next, a conductive film is formed in such a manner that the conductive film fills the second isolation groove 1320 and covers the second silicon semiconductor layer 1150. Here, by a sputtering method, a 50-nm-thick indium tin oxide film, a 100-nm-thick silver film, and a 300-nm-thick aluminum film are stacked in this order.

Figure 23D:
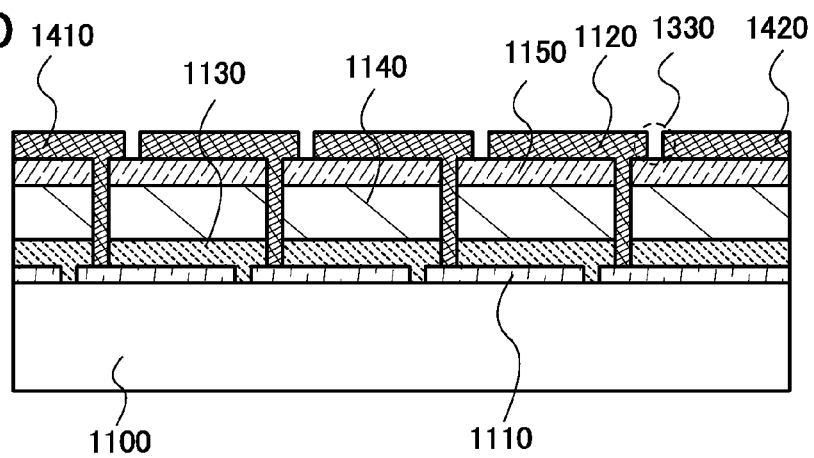

Then, a third isolation groove 1330 which divides the conductive film into a plurality of pieces is formed (see FIG. 23D). The isolation groove can be formed by laser processing or the like. As a laser used in this laser processing, a continuous wave laser or a pulsed laser which emits light in an infrared light region is preferably used. For example, a fundamental wave (wavelength: 1064 nm) or the like of an Nd-YAG laser can be used. In this step, the conductive film is processed to be divided, whereby the second electrode 1120, a first terminal 1410, and a second terminal 1420 are formed. The first terminal 1410 and the second terminal 1420 each serve as an extraction electrode.

In the above manner, the photoelectric conversion device of one embodiment of the present invention can be manufactured. Note that a method for manufacturing an integrated photoelectric conversion device in which the photoelectric conversion devices of FIG. 17 is integrated is described in this embodiment; however, the photoelectric conversion devices of FIG. 18 and the photoelectric conversion devices of FIG. 19 can also be integrated in a manner similar to the above.

Note that in order to integrate the photoelectric conversion devices illustrated in FIG. 20, first, a step of forming a structure similar to the structure of FIG. 23A is performed, and the first electrode 1210 formed using the light-transmitting conductive film which is divided into a plurality of pieces is formed over the substrate 1200. Note that in the case of forming unevenness of the light-transmitting conductive film as illustrated in FIG. 21, for example, a zinc-oxide-based light-transmitting conductive film may be formed and etched using strong acid such as hydrochloric acid.

Next, a step of forming a structure similar to the structure of FIG. 23B is performed, whereby the first light-transmitting semiconductor layer 1230, the first silicon semiconductor layer 1240, and the second silicon semiconductor layer 1250 are formed. Note that i-type amorphous silicon is used for the first silicon semiconductor layer 1240.

Next, the second light-transmitting semiconductor layer 1260 is formed over the second silicon semiconductor layer 1250. The second light-transmitting semiconductor layer 1260 can be formed by a method similar to the method for forming the first light-transmitting semiconductor layer 1230.

Next, as the third silicon semiconductor layer 1270, an i-type microcrystalline silicon or polycrystalline silicon film with a thickness of 10 μm is formed over the second light-transmitting semiconductor layer 1260. As a source gas, silane or disilane can be used, and hydrogen may be added thereto. At this time, an atmospheric component contained in the film serves as a donor in some cases; thus, boron (B) may be added to the source gas so that the conductivity type is closer to i-type. In this case, the concentration of boron in the i-type amorphous silicon is made to be higher than or equal to 0.001 at. % and lower than or equal to 0.1 at. %.

Figure 24A:
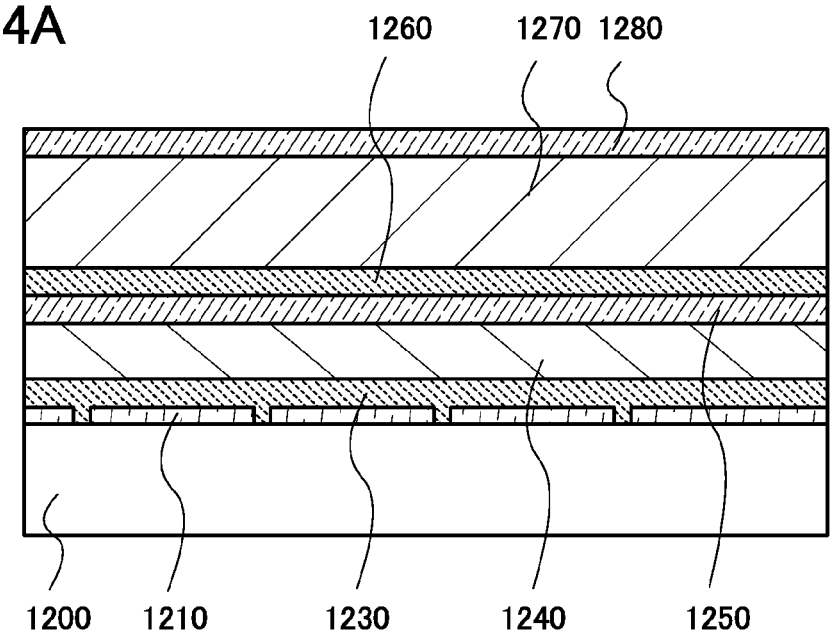
FIGS. 24A and 24B are cross-sectional views illustrating a process of a method for manufacturing a photoelectric conversion device of one embodiment of the present invention.

Next, the fourth silicon semiconductor layer 1280 is formed over the third silicon semiconductor layer 1270 (see FIG. 24A). The fourth silicon semiconductor layer 1280 can be formed by a method similar to the method for forming the second silicon semiconductor layer 1250.

Next, an isolation groove which divides a stacked layer including the first light-transmitting semiconductor layer 1230, the first silicon semiconductor layer 1240, the second silicon semiconductor layer 1250, the second light-transmitting semiconductor layer 1260, the third silicon semiconductor layer 1270, and the fourth silicon semiconductor layer 1280 into a plurality of pieces is formed. The isolation groove can be formed by a method similar to the method for forming the second isolation groove 1320 illustrated in FIG. 23C.

Note that in the case of providing the light-transmitting conductive film 1290 illustrated in FIG. 22, before the isolation groove which divides the stacked layer into a plurality of pieces is formed, the light-transmitting conductive film 1290 may be formed over the fourth silicon semiconductor layer 1280.

Next, a conductive film is formed in such a manner that the conductive film fills the isolation groove which divides the stacked layer into a plurality of pieces and covers the fourth silicon semiconductor layer 1280. For example, by a sputtering method, a 50-nm-thick indium tin oxide film, a 100-nm-thick silver film, and a 300-nm-thick aluminum film are stacked in this order.

Figure 24B:
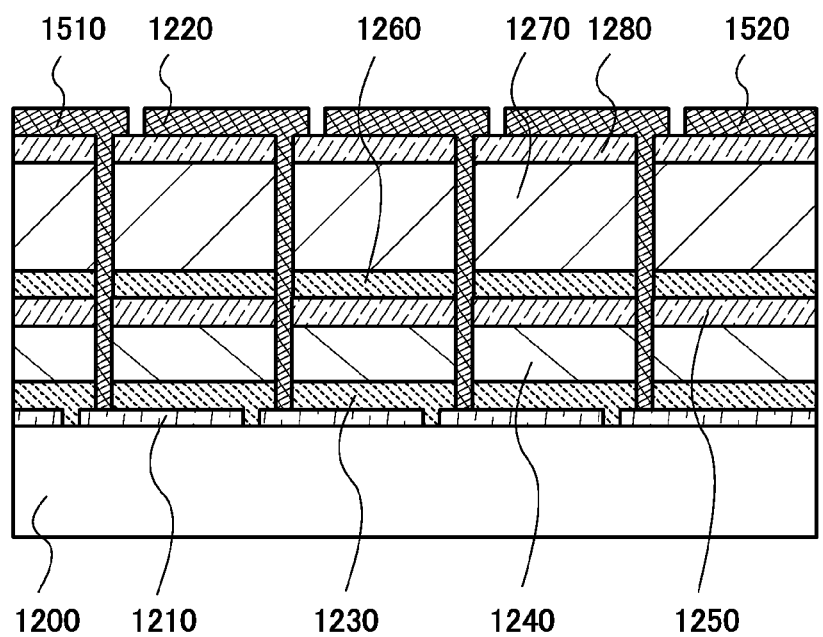

Then, an isolation groove which divides the conductive film into a plurality of pieces is formed, so that the second electrode 1220, the first terminal 1510, and the second terminal 1520 are formed (see FIG. 24B). The isolation groove can be formed by a method similar to the method for forming the third isolation groove 1330 illustrated in FIG. 23D.

Thus, a photoelectric conversion device in which the photoelectric conversion devices of FIG. 20 are integrated can be manufactured. Note that the photoelectric conversion devices of FIG. 21 and the photoelectric conversion devices of FIG. 22 can be integrated by a method similar to the above.

This embodiment can be freely combined with any of other embodiments.

EXAMPLE

In this example, experimental results of photoelectric conversion devices of embodiments of the present invention will be described.

Photoelectric conversion devices in each of which an inorganic compound containing a metal oxide as its main component was used for a window layer, which are specifically described in Embodiment 1, were formed, and the electric characteristics thereof were evaluated.

The photoelectric conversion devices in each of which a metal oxide was used for the window layer were manufactured to have the structure illustrated in FIG. 10 by the method described in Embodiment 2 (Cell A and Cell B). Further, as a comparative example, a photoelectric conversion device in which amorphous silicon was used for a window layer was formed (Cell C). The photoelectric conversion device was formed to have a structure in which the light-transmitting semiconductor layer 210 in FIG. 7 was replaced with a $p^+$-type amorphous silicon layer.

In each of Cells A, B, and C, an n-type single crystal silicon substrate was used as a silicon substrate. As a metal oxide of Cell A and a metal oxide of Cell B, p-type molybdenum oxide and tungsten oxide were used, respectively. The thicknesses thereof were each 10 nm. Further, the thickness of the pttype amorphous silicon layer of Cell C was 5 nm. Note that in the structure illustrated in FIG. 7, the total thickness of the amorphous silicon layer in the window layer, including the first silicon semiconductor layer 201, was 10 nm. Further, the cell areas of Cells A, B, and C were each 100 cm$^2$.

Figure 15:
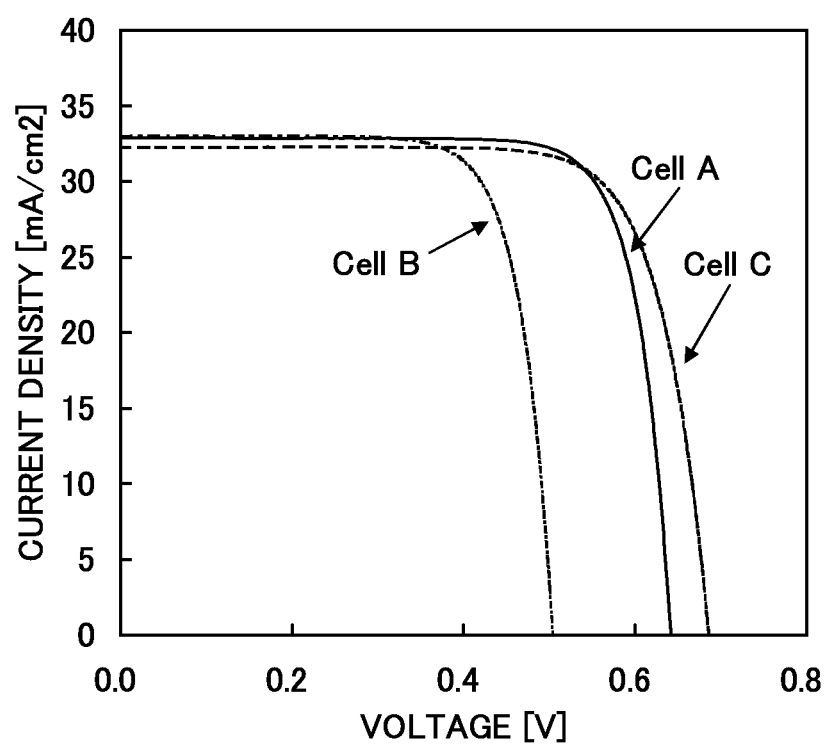
FIG. 15 shows comparison of the I-V characteristics among Cell A, Cell B, and Cell C.

FIG. 15 shows I-V characteristics of Cell A, Cell B, and Cell C. Simulated solar radiation (a solar spectrum was AM 1.5, and irradiation intensity was 100 mW/cm$^2$) generated by a solar simulator was used for the measurement. The current densities of Cell A, Cell B, and Cell C were 32.9 mA/cm$^2$, 33.0 mA/cm$^2$, 32.2 mA/cm$^2$, respectively. The current densities of Cell A and Cell B in each of which a metal oxide was used were higher than the current density of Cell C.

Figure 16:
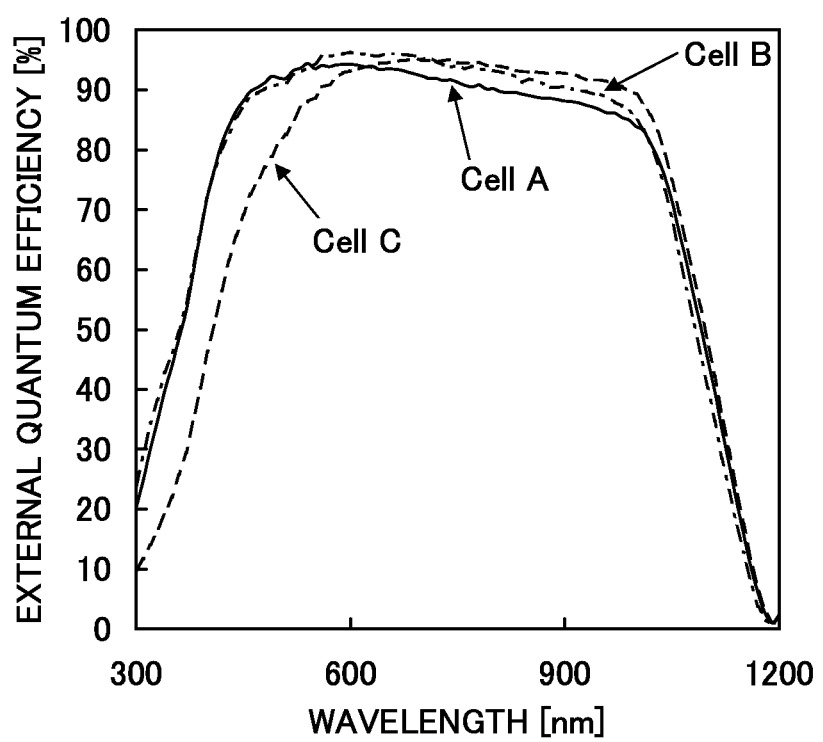
FIG. 16 shows comparison of the external quantum efficiency among Cell A, Cell B, and Cell C.

FIG. 16 shows a result of comparison of the external quantum efficiency among Cell A, Cell B, and Cell C. The external quantum efficiency of Cell A was high on a short wavelength side, reflecting the result of comparison of the transmittance between molybdenum oxide film and amorphous silicon film in FIG. 14, where molybdenum oxide film has higher transmittance. Further, the external quantum efficiency of tungsten oxide film was also high. Note that the external quantum efficiency of Cell C on a long wavelength side is higher than those of Cell A and Cell B on a long wavelength side. This is caused not due to the window layer of each of Cells A, B, and C but due to the size of unevenness or the shape of each of Cells A, B, and C.

The above results reveal that the photoelectric conversion device of one embodiment of the present invention has little light loss caused by light absorption in the window layer.

This example can be freely combined with any of the embodiments.

This application is based on Japanese Patent Application serial no. 2011-246341 filed with Japan Patent Office on Nov. 10, 2011, and Japanese Patent Application serial no. 2011-246346 filed with Japan Patent Office on Nov. 10, 2011, the entire contents of which are hereby incorporated by reference.

What is claimed is:

1. A photoelectric conversion device comprising:
    a silicon substrate having p-type conductivity or n-type conductivity;
    a light-transmitting semiconductor layer over a front surface of the silicon substrate, the light-transmitting semiconductor layer having a conductivity type opposite to that of the silicon substrate;
    a light-transmitting conductive film over the light-transmitting semiconductor layer;
    a first electrode over the light-transmitting conductive film;
    a first silicon semiconductor layer over a back surface of the silicon substrate;
    a second silicon semiconductor layer over the first silicon semiconductor layer; and
    a second electrode over the second silicon semiconductor layer;
    wherein the light-transmitting semiconductor layer comprises an inorganic compound comprising an oxide of a metal belonging to any of Groups 4 to 8 of the periodic table as its main component,
    wherein the first silicon semiconductor layer has i-type conductivity or the same conductivity type as the silicon substrate, and
    wherein the second silicon semiconductor layer has the same conductivity type as the silicon substrate.

2. The photoelectric conversion device according to claim 1, wherein the oxide of the metal comprises vanadium oxide, niobium oxide, tantalum oxide, chromium oxide, molybdenum oxide, tungsten oxide, manganese oxide, or rhenium oxide.

3. The photoelectric conversion device according to claim 1, wherein a band gap of the oxide of the metal is greater than or equal to 2 eV.

4. The photoelectric conversion device according to claim 1, wherein at least one of the front surface and the back surface of the silicon substrate has unevenness to give multiple reflection of incident light.

5. The photoelectric conversion device according to claim 1,
    wherein the first silicon semiconductor layer is non-single-crystal, amorphous, microcrystalline, or polycrystalline.

6. The photoelectric conversion device according to claim 1, wherein the first silicon semiconductor layer has a lower carrier concentration than the silicon substrate, and the second silicon semiconductor layer has a higher carrier concentration than the silicon substrate.

7. A photoelectric conversion device comprising:
a silicon substrate having p-type conductivity or n-type conductivity;
a first silicon semiconductor layer over a front surface of the silicon substrate, the first silicon semiconductor layer having i-type conductivity or a conductivity type opposite to that of the silicon substrate;
a light-transmitting semiconductor layer over the first silicon semiconductor layer, the light-transmitting semiconductor layer having a conductivity type opposite to that of the silicon substrate;
a light-transmitting conductive film over the light-transmitting semiconductor layer;
a first electrode over the light-transmitting conductive film;
a second silicon semiconductor layer over a back surface of the silicon substrate, the second silicon semiconductor layer having i-type conductivity or the same conductivity type as the silicon substrate;
a third silicon semiconductor layer over the second silicon semiconductor layer, the third silicon semiconductor layer having the same conductivity type as the silicon substrate; and
a second electrode over the third silicon semiconductor layer,
wherein the light-transmitting semiconductor layer comprises an inorganic compound comprising an oxide of a metal belonging to any of Groups 4 to 8 of the periodic table as its main component.

8. The photoelectric conversion device according to claim 7, wherein the oxide of the metal comprises vanadium oxide, niobium oxide, tantalum oxide, chromium oxide, molybdenum oxide, tungsten oxide, manganese oxide, or rhenium oxide.

9. The photoelectric conversion device according to claim 7, wherein a band gap of the oxide of the metal is greater than or equal to 2 eV.

10. The photoelectric conversion device according to claim 7, wherein the first silicon semiconductor layer is non-single-crystal, amorphous, microcrystalline, or polycrystalline.

11. The photoelectric conversion device according to claim 7, wherein the second silicon semiconductor layer has a lower carrier concentration than the silicon substrate, and the third silicon semiconductor layer has a higher carrier concentration than the silicon substrate.

12. The photoelectric conversion device according to claim 7, wherein the light-transmitting semiconductor layer has a higher carrier concentration than the first silicon semiconductor layer.

13. The photoelectric conversion device according to claim 7, wherein at least one of the front surface and the back surface of the silicon substrate has unevenness to give multiple reflection of incident light.

14. A photoelectric conversion device comprising:
a first electrode;
a first light-transmitting semiconductor layer over the first electrode, the first light-transmitting semiconductor layer having p-type conductivity or n-type conductivity;
a first silicon semiconductor layer over the first light-transmitting semiconductor layer, the first silicon semiconductor layer having i-type conductivity;
a second silicon semiconductor layer over the first silicon semiconductor layer, the second silicon semiconductor layer having a conductivity type opposite to that of the first light-transmitting semiconductor layer; and
a second electrode over the second silicon semiconductor layer,
wherein the first light-transmitting semiconductor layer is in contact with the first silicon semiconductor layer, and the first silicon semiconductor layer is in contact with the second silicon semiconductor layer; and
wherein the first light-transmitting semiconductor layer comprises an inorganic compound comprising an oxide of a metal belonging to any of Groups 4 to 8 of the periodic table as its main component.

15. The photoelectric conversion device according to claim 14, wherein the oxide of the metal comprises vanadium oxide, niobium oxide, tantalum oxide, chromium oxide, molybdenum oxide, tungsten oxide, manganese oxide, or rhenium oxide.

16. The photoelectric conversion device according to claim 14, wherein a band gap of the oxide of the metal is greater than or equal to 2 eV.

17. The photoelectric conversion device according to claim 14, wherein the first silicon semiconductor layer is non-single-crystal, amorphous, microcrystalline, or polycrystalline.

18. The photoelectric conversion device according to claim 14, wherein a surface of the first electrode has unevenness to give multiple reflection of incident light.

19. The photoelectric conversion device according to claim 14 further comprising,
a second light-transmitting semiconductor layer over the second silicon semiconductor layer, the second light-transmitting semiconductor layer having the same conductivity type as the first light-transmitting semiconductor layer;
a third silicon semiconductor layer over the second light-transmitting semiconductor layer, the third silicon semiconductor layer having i-type conductivity; and
a fourth silicon semiconductor layer between the third silicon semiconductor layer and the second electrode, the fourth silicon semiconductor layer having a conductivity type opposite to that of the first light-transmitting semiconductor layer,
wherein the second silicon semiconductor layer is in contact with the second light-transmitting semiconductor layer, the second light-transmitting semiconductor layer is in contact with the third silicon semiconductor layer, and the third silicon semiconductor layer is in contact with the fourth silicon semiconductor layer; and
wherein the second light-transmitting semiconductor layer are formed using an inorganic compound containing an oxide of a metal belonging to any of Groups 4 to 8 of the periodic table as its main component.

* * * * *